(12) United States Patent
Daimon et al.

(10) Patent No.: US 12,744,507 B2
(45) Date of Patent: Sep. 22, 2026

(54) ACOUSTIC WAVE DEVICE

(71) Applicant: Murata Manufacturing Co., Ltd., Nagaokakyo (JP)

(72) Inventors: Katsuya Daimon, Nagaokakyo (JP); Akihiro Iyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 127 days.

(21) Appl. No.: 18/769,657

(22) Filed: Jul. 11, 2024

(65) Prior Publication Data

US 2024/0364300 A1 Oct. 31, 2024

Related U.S. Application Data

(63) Continuation of application No. PCT/JP2023/000611, filed on Jan. 12, 2023.

(60) Provisional application No. 63/299,213, filed on Jan. 13, 2022.

(51) Int. Cl.
*H03H 9/02* (2006.01)
*H03H 9/56* (2006.01)

(52) U.S. Cl.
CPC .... *H03H 9/02228* (2013.01); *H03H 9/02015* (2013.01); *H03H 9/568* (2013.01)

(58) Field of Classification Search
CPC ........... H03H 9/02228; H03H 9/02015; H03H 9/568; H03H 9/02559; H03H 9/02574; H03H 9/145; H03H 9/25
USPC ................................ 333/186, 187, 193–196
See application file for complete search history.

(56) References Cited

U.S. PATENT DOCUMENTS 6,707,229 B1 3/2004 Martin
8,344,815 B2 1/2013 Yamanaka
9,130,145 B2 9/2015 Martin et al.
10,491,192 B1 11/2019 Plesski et al.
10,637,438 B2 4/2020 Garcia et al.
(Continued)

FOREIGN PATENT DOCUMENTS

CN 116131802 A 5/2023
JP 2007074754 A 3/2007
(Continued)

OTHER PUBLICATIONS

International Search Report in PCT/JP2023/000611, mailed Mar. 20, 2023, 3 pages.
(Continued)

*Primary Examiner* — Jorge L Salazar, Jr.
(74) *Attorney, Agent, or Firm* — Keating & Bennett, LLP

(57) ABSTRACT

An acoustic wave device includes a piezoelectric substrate including a support that includes a support substrate, and a piezoelectric layer located on the support, a functional electrode located on the piezoelectric layer and including at least one pair of electrode fingers, and a dielectric film located on the piezoelectric layer to cover the at least one pair of electrode fingers. An acoustic reflection portion is located at a position overlapping at least a portion of the functional electrode in plan view. Assuming a thickness of the piezoelectric layer is d and a center-to-center distance
(Continued)

between the electrode fingers adjacent to each other is p, d/p is about 0.5 or less. Angles of corners θ1, θ2, θ3, and θ4 are such that at least one of $\theta1 \neq \theta3$ or $\theta2 \neq \theta4$ is satisfied.

20 Claims, 13 Drawing Sheets

(56) References Cited

U.S. PATENT DOCUMENTS

| | | | |
|---|---|---|---|
| 10,826,462 | B2 | 11/2020 | Plesski et al. |
| 2003/0174028 | A1 | 9/2003 | Takayama et al. |
| 2004/0174233 | A1 | 9/2004 | Takayama et al. |
| 2010/0102669 | A1 | 4/2010 | Yamanaka |
| 2011/0199163 | A1 | 8/2011 | Yamanaka |
| 2014/0145556 | A1 | 5/2014 | Kadota |
| 2017/0077902 | A1 | 3/2017 | Daimon |
| 2019/0123721 | A1 | 4/2019 | Takamine |
| 2020/0021271 | A1 | 1/2020 | Plesski |
| 2021/0006228 | A1 | 1/2021 | Garcia |
| 2021/0013868 | A1 | 1/2021 | Plesski et al. |
| 2021/0226603 | A1 | 7/2021 | Iwamoto et al. |
| 2022/0216844 | A1 | 7/2022 | Yamane et al. |
| 2022/0231661 | A1 | 7/2022 | Mchugh et al. |
| 2023/0022219 | A1* | 1/2023 | Michigami .............. H03H 9/13 |

FOREIGN PATENT DOCUMENTS

| | | | |
|---|---|---|---|
| JP | 2010103803 | A | 5/2010 |
| WO | 2002035702 | A1 | 5/2002 |
| WO | 2010047114 | A1 | 4/2010 |
| WO | 2012137027 | A1 | 10/2012 |
| WO | 2013021948 | A1 | 2/2013 |
| WO | 2015182521 | A1 | 12/2015 |
| WO | 2018003273 | A1 | 1/2018 |
| WO | 2020080465 | A1 | 4/2020 |
| WO | 2021060513 | A1 | 4/2021 |

OTHER PUBLICATIONS

Written Opinion in PCT/JP2023/000611, mailed Mar. 20, 2023, 4 pages.

International Search Report and Written Opinion for PCT Application No. PCT/US2022/081095, mailed May 30, 2023, 12 pages.

* cited by examiner

FIG. 1
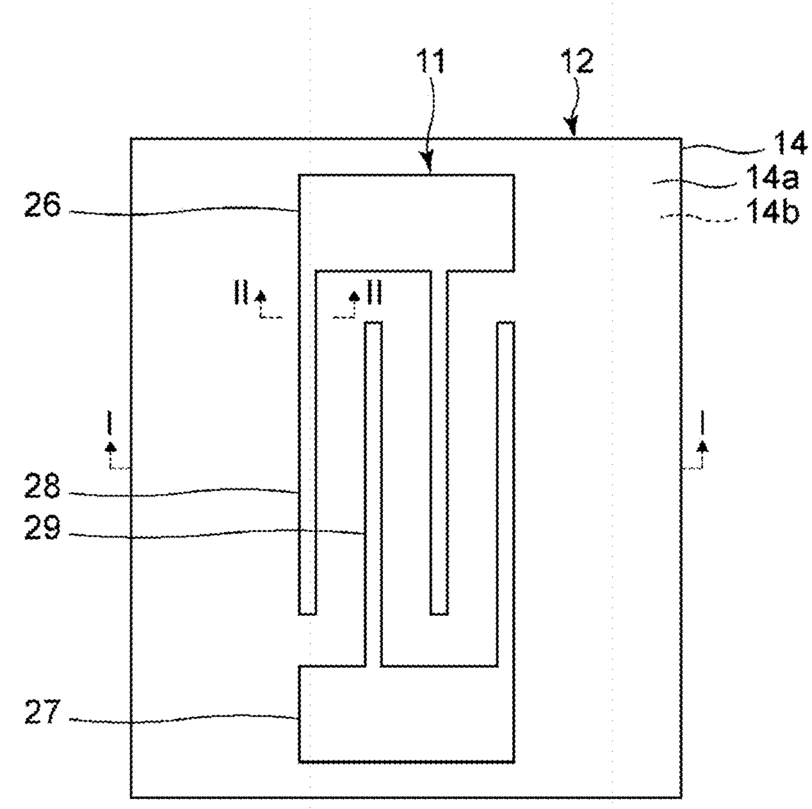
FIG. 2
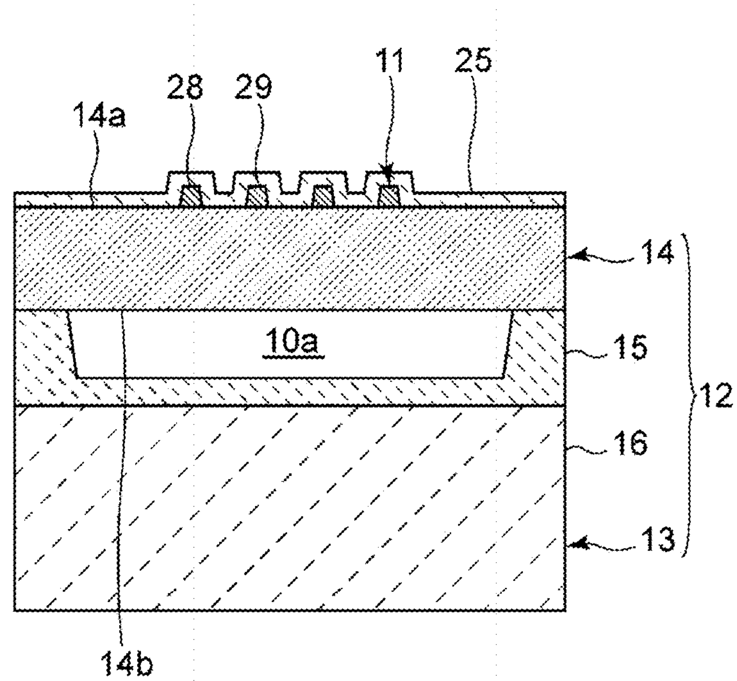

FIRST EMBODIMENT
FIRST COMPARATIVE EXAMPLE
ADMITTANCE Y11[dB]
-70
-80
-90
-100
-110
-120
-130
-140
-150
F
4000
4250
4500
4750
5000
FREQUENCY [MHz]

11
35
N3
25a
11b
11d
25d
25f
11c
25c
25e
θ4
θ3
25b
14
θ2
28
11a
N1
14a
θ1
25g

SECOND EMBODIMENT
FIRST COMPARATIVE EXAMPLE
F
ADMITTANCE Y11[dB]
-70
-80
-90
-100
-110
-120
-130
-140
-150
4000
4250
4500
4750
5000
FREQUENCY [MHz]

11
45
N3
25a
11b
11d
45d
25f
11c
45c
25e
t2
t1
θ4
θ3
25b
14
θ2
28
11a
N1
14a
θ1
25g 11
115
N3
25a
11b
11d
11c
t2
t1
θ4
θ3
25b
14
θ2
28
11a
N1
14a
θ1
25g

THIRD EMBODIMENT
SECOND COMPARATIVE EXAMPLE
F1
F2
ADMITTANCE Y11 [dB]
-67
-70
-80
-90
-100
-110
-120
-130
-140
-147
4300
4400
4500
4600
4700
4800
4900
5000
5100
FREQUENCY [MHz]

FIG. 11
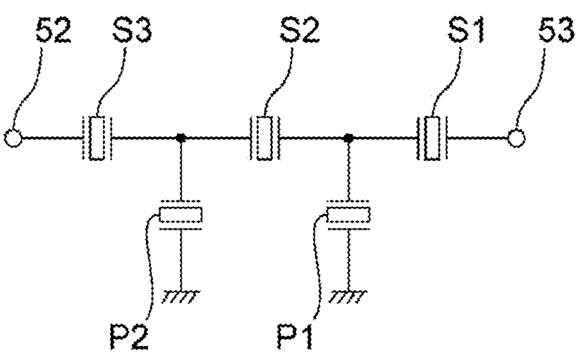

ACOUSTIC WAVE DEVICE

CROSS REFERENCE TO RELATED APPLICATIONS

This application claims the benefit of priority to Provisional Application No. 63/299,213 filed on Jan. 13, 2022 and is a Continuation Application of PCT Application No. PCT/JP2023/000611 filed on Jan. 12, 2023. The entire contents of each application are hereby incorporated herein by reference.

BACKGROUND OF THE INVENTION

1. Field of the Invention

The present invention relates to acoustic wave devices.

2. Description of the Related Art

In the related art, an acoustic wave device has been widely used for a filter or the like of a mobile phone. In recent years, as described in U.S. Pat. No. 10,491,192, an acoustic wave device using a bulk wave in a thickness shear mode has been proposed. In the acoustic wave device, a piezoelectric layer is provided on a support. A pair of electrodes are provided on the piezoelectric layer. The pair of electrodes face each other on the piezoelectric layer and are connected to different potentials. By applying an alternating-current (AC) voltage between the electrodes, the bulk wave in the thickness shear mode is excited.

SUMMARY OF THE INVENTION

In the acoustic wave device described in U.S. Pat. No. 10,491,192, for example, a protective film may be provided on the piezoelectric layer to cover the electrode for exciting an acoustic wave. The present inventors have discovered that, in a case where the protective film is provided as described above, an unnecessary wave caused by the protective film is generated. A frequency at which the unnecessary wave is generated is close to a resonant frequency. Therefore, in a case where the acoustic wave device is used in a filter device, there is a concern that filter characteristics are deteriorated.

Example embodiments of the present invention provide acoustic wave devices that reduce or prevent an unnecessary wave in a vicinity of a resonant frequency.

According to an example embodiment of the present invention, an acoustic wave device includes a piezoelectric substrate including a support that includes a support substrate, and a piezoelectric layer that is provided on the support and includes lithium tantalate or lithium niobate, a functional electrode provided on the piezoelectric layer and including at least one pair of electrode fingers, and a dielectric film provided on the piezoelectric layer to cover the at least one pair of electrode fingers, in which an acoustic reflection portion is provided at a position overlapping at least a portion of the functional electrode in plan view, in a case where a thickness of the piezoelectric layer is d and a center-to-center distance between the electrode fingers adjacent to each other is p, d/p is about 0.5 or less, the electrode finger includes a first surface and a second surface that face each other in a thickness direction, and a side surface that is connected to the first surface and the second surface, the first surface being located on a piezoelectric layer side, the side surface of the electrode finger includes a first side surface portion and a second side surface portion that face each other in a direction perpendicular or substantially perpendicular a direction in which the electrode finger extends, the dielectric film includes a first side surface cover portion that covers the first side surface portion of the electrode finger, and a second side surface cover portion that covers the second side surface portion, the first side surface cover portion including a first outer surface, the second side surface cover portion including a second outer surface, and in a case where an angle of a corner defined by the first surface and the first side surface portion of the electrode finger is $\theta 1$, an angle of a corner defined by the first surface and the second side surface portion is $\theta 2$, an angle of a corner defined by a first virtual plane extending parallel or substantially parallel to the first surface from an edge portion of the first outer surface of the dielectric film on the piezoelectric layer side toward a second side surface cover portion side, and the first outer surface is $\theta 3$, and an angle of a corner defined by a second virtual plane extending parallel or substantially parallel to the first surface from an edge portion of the second outer surface on the piezoelectric layer side toward a first side surface cover portion side, and the second outer surface is $\theta 4$, at least one of $\theta 1 \neq \theta 3$ or $\theta 2 \neq \theta 4$ is satisfied.

According to example embodiments of the present invention, it is possible to provide acoustic wave devices that reduce or prevent unnecessary waves in a vicinity of a resonant frequency.

The above and other elements, features, steps, characteristics and advantages of the present invention will become more apparent from the following detailed description of the example embodiments with reference to the attached drawings.

BRIEF DESCRIPTION OF THE DRAWINGS

FIG. 1 is a schematic plan view of an acoustic wave device according to a first example embodiment of the present invention.

FIG. 2 is a schematic cross-sectional view taken along line I-I in FIG. 1.

FIG. 11 is a circuit diagram of a filter device according to a fourth example embodiment of the present invention.

FIG. 16 is a view showing resonance characteristics of the acoustic wave device using the bulk wave in the thickness shear mode.

DETAILED DESCRIPTION OF THE EXAMPLE EMBODIMENTS

Figure 3:
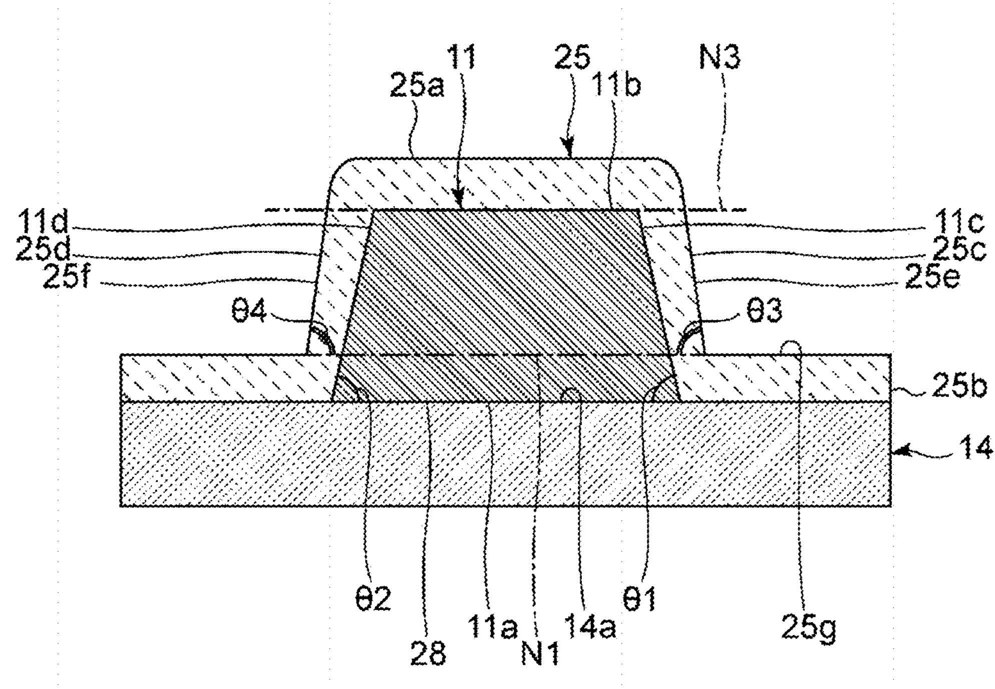
FIG. 3 is a schematic cross-sectional view showing a vicinity of a first electrode finger along line II-II in FIG. 1.

Hereinafter, the present invention will be clarified by describing specific example embodiments of the present invention with reference to the accompanying drawings.

It should be noted that each of example embodiments described in the present specification is merely an example, and partial replacement or combination of the configurations can be made between different example embodiments.

FIG. 1 is a schematic plan view of an acoustic wave device according to a first example embodiment of the present invention. FIG. 2 is a schematic cross-sectional view taken along line I-I in FIG. 1. In FIG. 1, a dielectric film to be described later is not shown.

As shown in FIG. 1, the acoustic wave device 10 includes a piezoelectric substrate 12 and an interdigital transducer (IDT) electrode 11. As shown in FIG. 2, the piezoelectric substrate 12 includes a support 13 and a piezoelectric layer 14. In the present example embodiment, the support 13 includes a support substrate 16 and an insulating layer 15. The insulating layer 15 is provided on the support substrate 16. The piezoelectric layer 14 is provided on the insulating layer 15. However, the support 13 may be configured only by the support substrate 16.

The piezoelectric layer 14 has a first main surface 14*a* and a second main surface 14*b*. The first main surface 14*a* and the second main surface 14*b* face each other. Out of the first main surface 14*a* and the second main surface 14*b*, the second main surface 14*b* is located on the support 13 side.

As the material of the support substrate 16, for example, a semiconductor such as silicon, a ceramic such as aluminum oxide, or the like can be used. As the material of the insulating layer 15, an appropriate dielectric such as silicon oxide or tantalum oxide can be used. The piezoelectric layer 14 is, for example, a lithium niobate layer such as a $LiNbO_3$ layer or a lithium tantalate layer such as a $LiTaO_3$ layer.

As shown in FIG. 2, a recess portion is provided in the insulating layer 15. The piezoelectric layer 14 is provided on the insulating layer 15 to close the recess portion. As a result, a hollow portion is provided. The hollow portion includes a cavity portion 10*a*. In the present example embodiment, the support 13 and the piezoelectric layer 14 are disposed such that a portion of the support 13 and a portion of the piezoelectric layer 14 face each other with the cavity portion 10*a* interposed therebetween. However, the recess portion in the support 13 may be provided over the insulating layer 15 and the support substrate 16. Alternatively, the recess portion provided only in the support substrate 16 may be closed by the insulating layer 15. The recess portion may be provided in the piezoelectric layer 14. It should be noted that the cavity portion 10*a* may be a through hole provided in the support 13.

The IDT electrode 11 as a functional electrode is provided on the first main surface 14*a* of the piezoelectric layer 14. The dielectric film 25 is provided on the first main surface 14*a* to cover the IDT electrode 11. As the material of the dielectric film 25, for example, silicon oxide, silicon nitride, silicon oxynitride, or the like can be used. However, the material of the dielectric film 25 is not limited to the above-described material.

In plan view, at least a portion of the IDT electrode 11 overlaps the cavity portion 10*a* of the piezoelectric substrate 12. In the present specification, "in plan view" means that the support 13 and the piezoelectric layer 14 are viewed along a laminating direction from a direction corresponding to an up direction in FIG. 2. It should be noted that, in FIG. 2, for example, the piezoelectric layer 14 side is an upper side of the support substrate 16 and the piezoelectric layer 14.

As shown in FIG. 1, the IDT electrode 11 includes one pair of busbars and a plurality of electrode fingers. Specifically, the one pair of busbars are a first busbar 26 and a second busbar 27. The first busbar 26 and the second busbar 27 face each other. The plurality of electrode fingers are, specifically, a plurality of first electrode fingers 28 and a plurality of second electrode fingers 29. One end of each of the plurality of first electrode fingers 28 is connected to the first busbar 26. One end of each of the plurality of second electrode fingers 29 is connected to the second busbar 27. The plurality of first electrode fingers 28 and the plurality of second electrode fingers 29 are interdigitated with each other. The IDT electrode 11 may include a single metal film or a laminated metal film.

The functional electrode according to an example embodiment of the present invention need only include at least one pair of the first electrode finger 28 and the second electrode finger 29.

Hereinafter, the first electrode finger 28 and the second electrode finger 29 may be simply referred to as an electrode finger. In a case where a direction in which the plurality of electrode fingers extend is an electrode finger extending direction and a direction in which the electrode fingers adjacent to each other face each other is an electrode finger facing direction, in the present example embodiment, the electrode finger extending direction and the electrode finger facing direction are perpendicular or substantially perpendicular to each other.

FIG. 3 is a schematic cross-sectional view showing the vicinity of the first electrode finger along line II-II in FIG. 1.

Each first electrode finger 28 has a first surface 11*a* and a second surface 11*b*. The first surface 11*a* and the second surface 11*b* face each other in a thickness direction. The first surface 11*a* out of the first surface 11*a* and the second surface 11*b* is located on the piezoelectric layer 14 side. Each first electrode finger 28 has a side surface. The side surface is connected to the first surface 11*a* and the second surface 11*b*. More specifically, the side surface includes a first side surface portion 11*c* and a second side surface portion 11*d*. The first side surface portion 11*c* and the second side surface portion 11*d* face each other in a direction perpendicular or substantially perpendicular the electrode finger extending direction.

An angle of a corner defined by the first surface 11*a* and the first side surface portion 11*c* is θ1. An angle of a corner defined by the first surface 11*a* and the second side surface portion 11*d* is θ2. In the present example embodiment, θ1<90° and θ2<90°, for example.

The acoustic wave device 10 according to the present example embodiment is an acoustic wave resonator configured to use a bulk wave in a thickness shear mode. More specifically, in the acoustic wave device 10, in a case where a thickness of the piezoelectric layer 14 is d and a center-to-center distance of the electrode fingers adjacent to each other is p, d/p is about 0.5 or less, for example. As a result, the bulk wave in the thickness shear mode is suitably excited. It should be noted that, a region in which the adjacent electrode fingers overlap each other when seen from the electrode finger facing direction and a region between the centers of the adjacent electrode fingers, is an excitation region. In each excitation region, the bulk wave of the thickness shear mode is excited.

The cavity portion 10*a* shown in FIG. 2 is an acoustic reflection portion according to an example embodiment of the present invention. The acoustic reflection portion can effectively confine the energy of an acoustic wave on the piezoelectric layer 14 side. It should be noted that, as the acoustic reflection portion, an acoustic reflection film such as an acoustic multilayer film described later may be provided.

As described above, the dielectric film 25 covers the IDT electrode 11. As shown in FIG. 3, the dielectric film 25 has a piezoelectric layer cover portion 25*b* and a side surface cover portion. Specifically, the side surface cover portion includes a first side surface cover portion 25*c* and a second side surface cover portion 25*d*. However, hereinafter, the first side surface cover portion 25*c* and the second side surface cover portion 25*d* may be simply referred to as the side surface cover portion.

The piezoelectric layer cover portion 25*b* is a portion that covers the piezoelectric layer 14. The side surface cover portion is a portion that covers the side surface of the electrode finger. More specifically, the first side surface cover portion 25*c* covers the first side surface portion 11*c* of the electrode finger. The second side surface cover portion 25*d* covers the second side surface portion 11*d* of the electrode finger. Therefore, the first side surface cover portion 25*c* and the second side surface cover portion 25*d* face each other in the direction perpendicular or substantially perpendicular the electrode finger extending direction.

The first side surface cover portion 25*c* includes a first outer surface 25*e*. The first outer surface 25*e* faces a surface of the first side surface cover portion 25*c* on the electrode finger side. The second side surface cover portion 25*d* includes a second outer surface 25*f*. The second outer surface 25*f* faces a surface of the second side surface cover portion 25*d* on the electrode finger side. The piezoelectric layer cover portion 25*b* includes a third outer surface 25*g*. The third outer surface 25*g* faces a surface of the piezoelectric layer cover portion 25*b* on the piezoelectric layer 14 side.

A virtual plane extending parallel or substantially parallel to the first surface 11*a* from an edge portion of the first outer surface 25*e* on the piezoelectric layer 14 side toward the second side surface cover portion 25*d* side is a first virtual plane N1. An angle of a corner defined by the first virtual plane N1 and the first outer surface 25*e* is θ3.

On the other hand, a virtual plane extending parallel or substantially parallel to the first surface 11*a* from an edge portion of the second outer surface 25*f* on the piezoelectric layer 14 side toward the first side surface cover portion 25*c* side is a second virtual plane. In the present example embodiment, the first virtual plane N1 and the second virtual plane are the same virtual plane. An angle of a corner defined by the second virtual plane and the second outer surface 25*f* is θ4.

The edge portion of the first outer surface 25*e* on the piezoelectric layer 14 side is a portion in which the first outer surface 25*e* is connected to the third outer surface 25*g* of the piezoelectric layer cover portion 25*b*. Here, a plane including the second surface 11*b* of the electrode finger is a third virtual plane N3. The other edge portion of the first outer surface 25*e* is a portion in which the first outer surface 25*e* is in contact with the third virtual plane N3. As described above, the first virtual plane N1 extends from the edge portion of the first outer surface 25*e* on the piezoelectric layer 14 side. Therefore, the first side surface cover portion 25*c* is a portion located between the first virtual plane N1 and the third virtual plane N3.

Similarly, the edge portion of the second outer surface 25*f* on the piezoelectric layer 14 side is a portion in which the second outer surface 25*f* is connected to the third outer surface 25*g* of the piezoelectric layer cover portion 25*b*. The second side surface cover portion 25*d* is a portion located between the second virtual plane and the third virtual plane N3.

The first virtual plane N1 and the second virtual plane may be virtual planes different from each other. This case corresponds to a case where, for example, a thickness of the portion of the piezoelectric layer cover portion 25*b* connected to the first side surface cover portion 25*c* and a thickness of the portion of the piezoelectric layer cover portion 25*b* connected to the second side surface cover portion 25*d* are different from each other. The thickness of the piezoelectric layer cover portion 25*b* is a dimension of the piezoelectric layer cover portion 25*b* along a normal direction of the first main surface 14*a* of the piezoelectric layer 14.

In FIG. 3, a portion of the dielectric film 25 that covers the first electrode finger 28 and the vicinity of the portion is shown. However, in the dielectric film 25, the first side surface cover portion and the second side surface cover portion are also provided in a portion of the dielectric film 25, that covers the second electrode finger 29 and the vicinity of the portion. The first side surface cover portion and the second side surface cover portion include the first outer surface and the second outer surface. The first virtual plane, the second virtual plane, the third virtual plane, and the angles $\theta1$ to $\theta4$ can be defined.

One of the unique features of the present example embodiment is that $\theta1<\theta3$ and $\theta2<\theta4$. However, an acoustic wave device according to an example embodiment of the present invention need only satisfy at least one of $\theta1\neq\theta3$ or $\theta2/\theta4$. As a result, the unnecessary wave can be reduced or prevented in the vicinity of the resonant frequency. This effect will be shown below by comparing the present example embodiment with a first comparative example.

Figure 4:
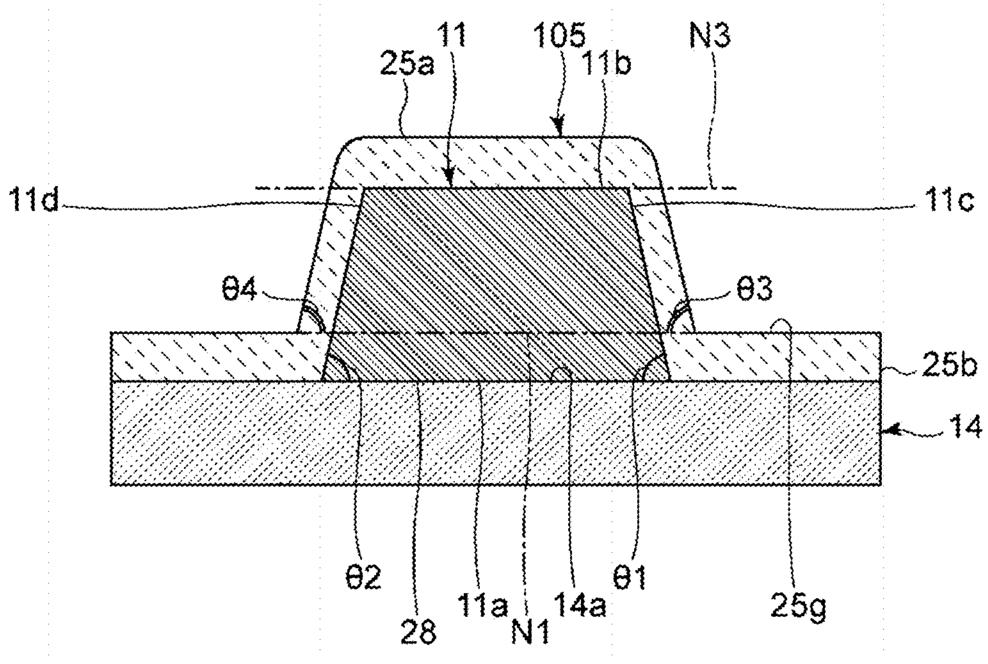
FIG. 4 is a schematic elevational cross-sectional view showing a vicinity of one electrode finger in a first comparative example.

The first comparative example is different from the first example embodiment in that, as shown in FIG. 4, $\theta1=\theta3$ and $\theta2=\theta4$ in the dielectric film 105. The acoustic wave device 1 having the configuration of the first example embodiment and an acoustic wave device according to the first comparative example are prepared, and the admittance frequency characteristics are measured.

Figures 5, 6:
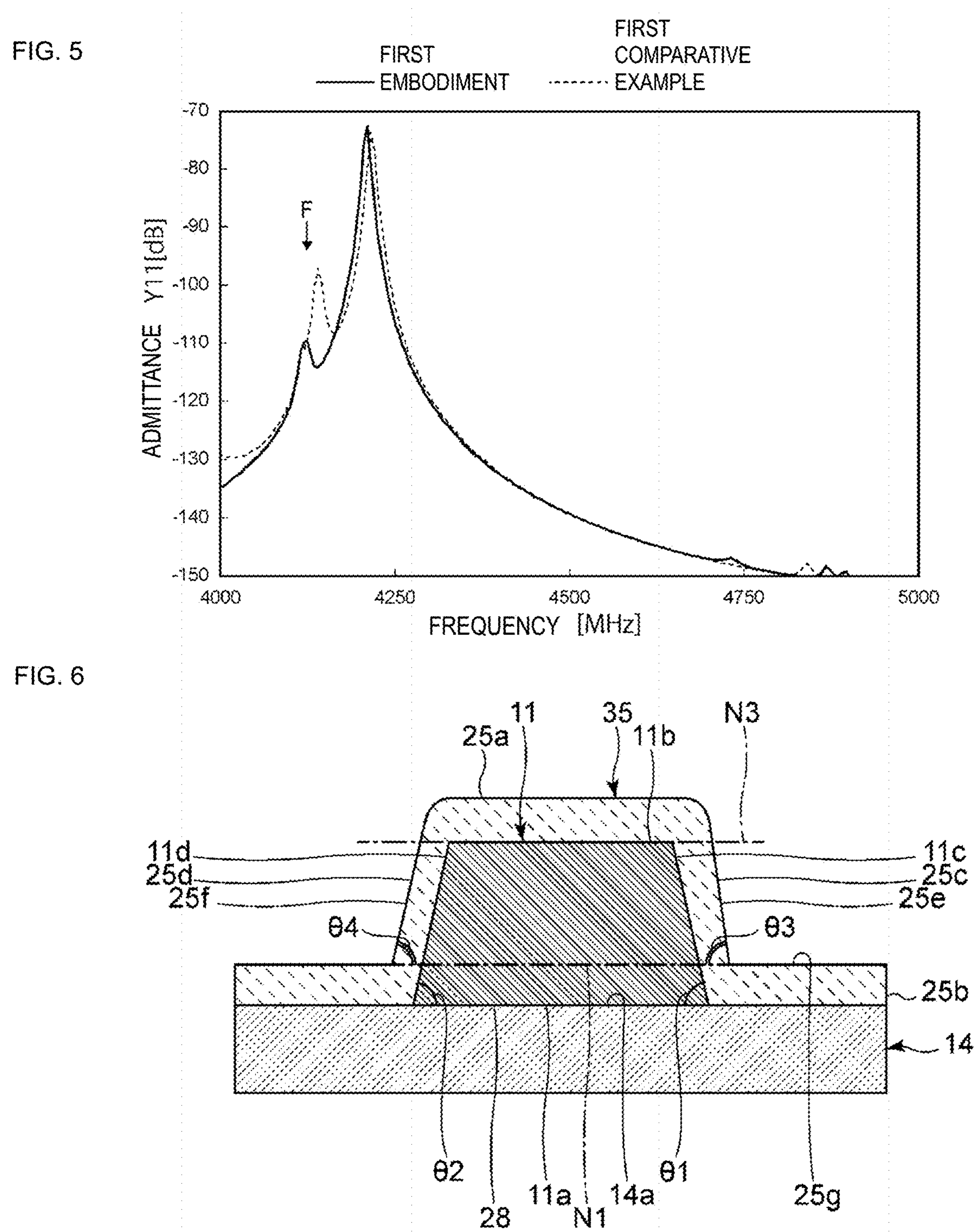
FIG. 5 is a view showing admittance frequency characteristics in the first example embodiment of the present invention and the first comparative example.
FIG. 6 is a schematic elevational cross-sectional view showing a vicinity of a first electrode finger in a second example embodiment of the present invention.

FIG. 5 is a view showing the admittance frequency characteristics in the first example embodiment and the first comparative example. An arrow F in FIG. 5 indicates the vicinity of the frequency at which the unnecessary wave is generated.

As shown in FIG. 5, it can be seen that the unnecessary wave can be further reduced or prevented in the vicinity of the resonant frequency in the first example embodiment than in the first comparative example.

In the first example embodiment shown in FIG. 2, the dielectric film 25 is provided on the piezoelectric layer 14 to cover the entire IDT electrode 11. However, the dielectric film 25 need only cover the plurality of electrode fingers.

In the acoustic wave device 1, the IDT electrode 11 and the dielectric film 25 are provided on the first main surface 14*a* of the piezoelectric layer 14. However, the IDT electrode 11 and the dielectric film 25 need only be provided on the first main surface 14*a* or the second main surface 14*b* of the piezoelectric layer 14. Even in a case where the IDT electrode 11 and the dielectric film 25 are provided on the second main surface 14*b*, the unnecessary wave can be reduced or prevented in the vicinity of the resonant frequency as in the first example embodiment.

FIG. 6 is a schematic elevational cross-sectional view showing a vicinity of a first electrode finger in a second example embodiment.

The present example embodiment is different from the first example embodiment in that $\theta1<\theta3$ and $\theta2=\theta4$ in each electrode finger and the dielectric film 35. Except for the above points, the acoustic wave device according to the present example embodiment has the same configuration as the acoustic wave device 10 according to the first example embodiment.

In FIG. 6, a portion of the dielectric film 35 that covers the first electrode finger 28 and the vicinity of the portion is shown. However, in the portion of the dielectric film 35 that covers the second electrode finger 29 and the vicinity of the portion, $\theta1<\theta3$ and $\theta2=\theta4$.

In the second example embodiment as well, the unnecessary wave can be reduced or prevented in the vicinity of the resonant frequency, as in the first example embodiment. This effect will be shown below by comparing the second example embodiment will the first comparative example. In the first comparative example, $\theta1=\theta3$ and $\theta2=\theta4$. The acoustic wave device having the configuration of the second example embodiment and the acoustic wave device according to the first comparative example are prepared, and the admittance frequency characteristics are measured.

Figures 7, 8:
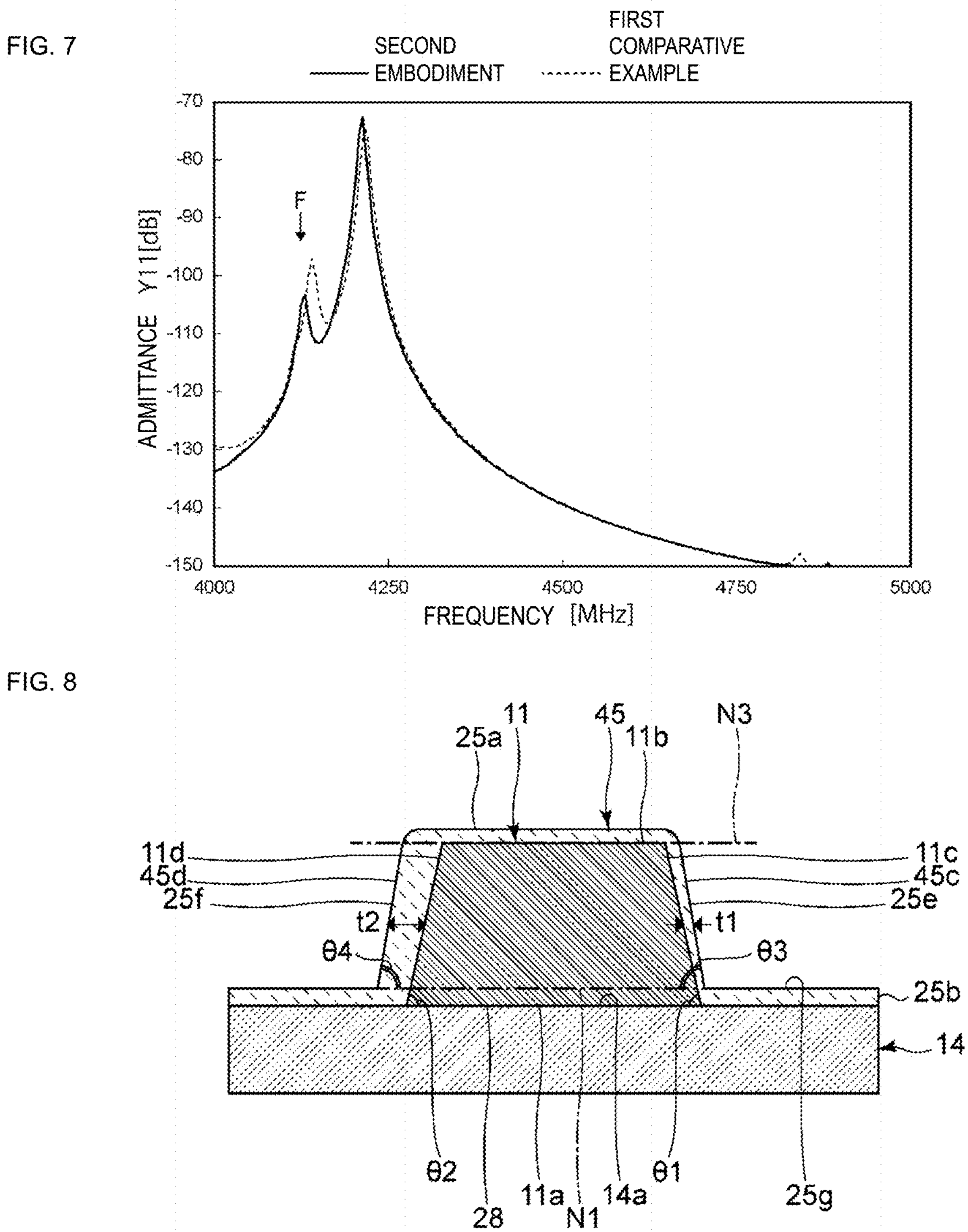
FIG. 7 is a view showing admittance frequency characteristics in the second example embodiment of the present invention and the first comparative example.
FIG. 8 is a schematic elevational cross-sectional view showing a vicinity of a first electrode finger in a third example embodiment of the present invention.

FIG. 7 is a view showing the admittance frequency characteristics in the second example embodiment and the first comparative example. An arrow F in FIG. 7 indicates the vicinity of the frequency at which the unnecessary wave is generated.

As shown in FIG. 7, it can be seen that the unnecessary wave can be further reduced or prevented in the vicinity of the resonant frequency in the second example embodiment than in the first comparative example. It should be noted that the acoustic wave device according to the second example embodiment satisfies $\theta1<\theta3$ and does not satisfy $\theta2=\theta4$. In this way, even in a case where the acoustic wave device satisfies only one of $\theta1\neq\theta3$ or $\theta2\neq\theta4$, the unnecessary wave caused by the dielectric film 35 can be reduced or prevented in the vicinity of the resonant frequency.

In the first comparative example shown in FIG. 4, the unnecessary wave caused by the dielectric film 105 is generated in the vicinity of the resonant frequency and on the lower frequency side with respect to the resonant frequency. On the other hand, in the first and second example embodiments, the unnecessary wave can be reduced or prevented. However, the unnecessary wave caused by the dielectric film may be generated in the vicinity of the resonant frequency and on the higher frequency side with respect to the resonant frequency. In example embodiments of the present invention, the unnecessary wave can also be reduced or prevented. This example is described by a third example embodiment.

FIG. 8 is a schematic elevational cross-sectional view showing a vicinity of a first electrode finger in the third example embodiment.

The present example embodiment is different from the first example embodiment in that, in a case where a thickness of the first side surface cover portion 45*c* of the dielectric film 45 is t1 and a thickness of the second side surface cover portion 45*d* is t2, $t1\neq t2$. Except for the above points, the acoustic wave device according to the present example embodiment has the same configuration as the acoustic wave device 10 according to the first example embodiment. That is, the acoustic wave device according to the present example embodiment satisfies both $\theta1<\theta3$ and $\theta2<\theta4$.

More specifically, a direction, which is perpendicular or substantially perpendicular to the electrode finger extending direction and is parallel or substantially parallel to the first surface 11*a* of the electrode finger, is a thickness direction of the side surface cover portion of the dielectric film 45. The thickness t1 of the first side surface cover portion 45*c* is a dimension of the first side surface cover portion 45*c* along the thickness direction. The thickness t2 of the second side surface cover portion 45*d* is a dimension of the second side surface cover portion 45*d* along the thickness direction.

In the present example embodiment, the thickness t1 and the thickness t2 are different from each other regardless of the portions of the first side surface cover portion 45*c* and the second side surface cover portion 45*d*. In the present example embodiment, a minimum value of the thickness t2 of the second side surface cover portion 45*d* is larger than a maximum value of the thickness t1 of the first side surface cover portion 45*c*.

However, for example, the thickness t1 and the thickness t2 of the first side surface cover portion 45*c* and the second side surface cover portion 45*d* need only be different from each other at the same position in a direction in which the first surface 11*a* and the second surface 11*b* of the electrode finger face each other. In other words, in a case where the thicknesses t1 and t2 of the portions of the first side surface cover portion 45*c* and the second side surface cover portion 45*d* through which the same virtual line extending in the thickness direction of the side surface cover portion are compared with each other, it is sufficient that t1 #t2.

In FIG. 8, a portion of the dielectric film 45 that covers the first electrode finger 28 and the vicinity of the portion is shown. However, in the portion of the dielectric film 45 that covers the second electrode finger 29 and the vicinity of the portion, θ1<θ3, θ2<θ4, and t1≠t2.

In the present example embodiment as well, the unnecessary wave can be reduced or prevented in the vicinity of the resonant frequency, as in the first example embodiment. This effect will be shown below by comparing the present example embodiment will a second comparative example.

Figures 9, 10:
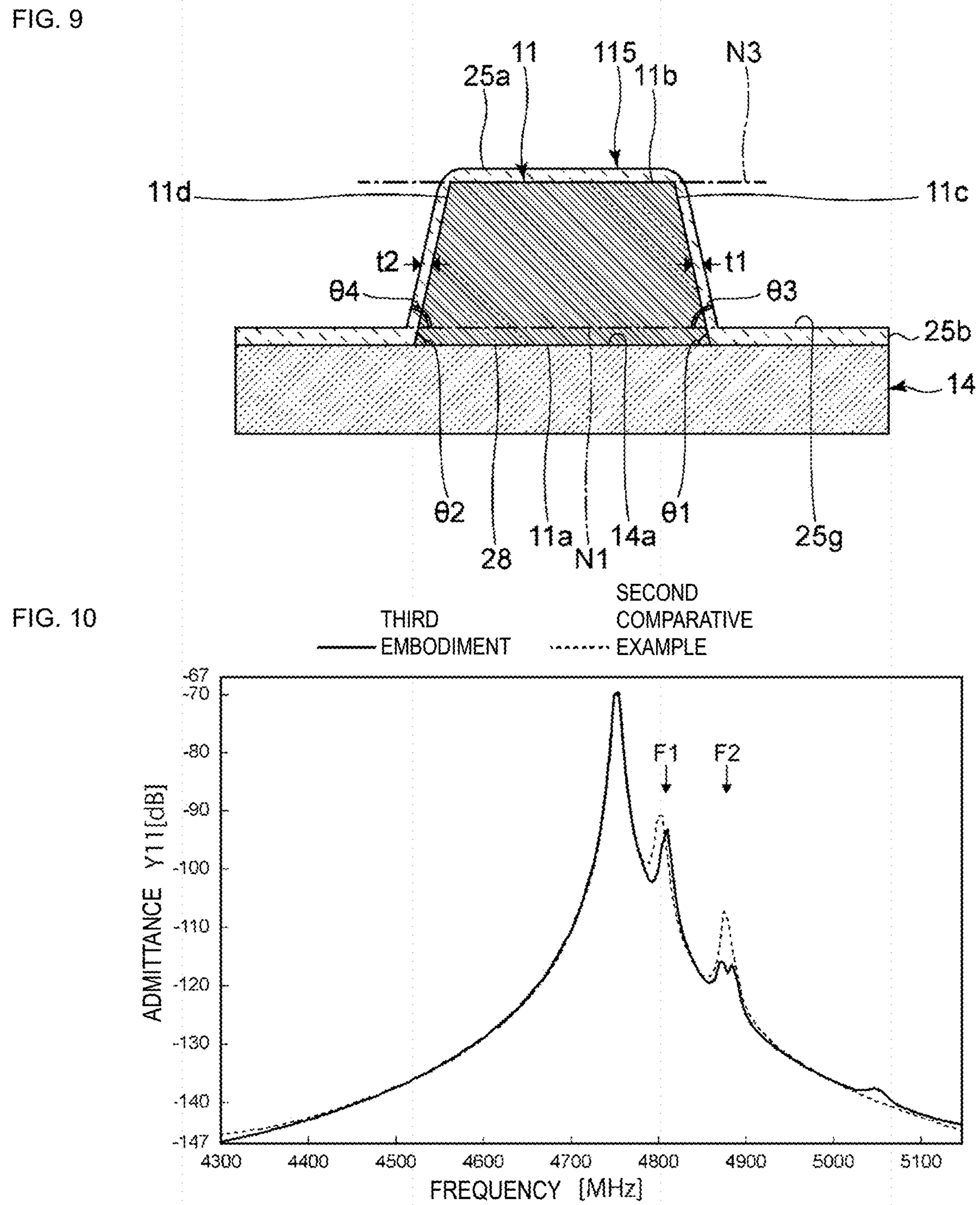
FIG. 9 is a schematic elevational cross-sectional view showing a vicinity of one electrode finger in a second comparative example.
FIG. 10 is a view showing admittance frequency characteristics in a third example embodiment of the present invention and the second comparative example.

The second comparative example is different from the third example embodiment in that, as shown in FIG. 9, θ1=θ3, θ2=θ4, and t1=t2 in the dielectric film 115. The thickness t1 and the thickness t2 of the dielectric film 115 in the second comparative example are values between the maximum value and a minimum value of the thickness t1 of the dielectric film 45 in the third example embodiment.

The acoustic wave device having the configuration of the third example embodiment and an acoustic wave device according to the second comparative example are prepared, and the admittance frequency characteristics are measured.

FIG. 10 is a view showing the admittance frequency characteristics in the third example embodiment and the second comparative example. An arrow F1 and an arrow F2 in FIG. 10 indicate the vicinity of the frequency at which the unnecessary wave is generated.

As shown in FIG. 10, it can be seen that the unnecessary wave can be further reduced or prevented in the vicinity of the resonant frequency in the third example embodiment than in the second comparative example. More specifically, in the third example embodiment, it is possible to reduce or prevent the unnecessary wave on the higher frequency side with respect to the resonant frequency. In the third example embodiment, the unnecessary wave can be reduced or prevented, particularly in the vicinity of the frequency indicated by the arrow F2.

An acoustic wave device according to an example embodiment of the present invention can be used, for example, in a filter device. This example is described by a fourth example embodiment.

FIG. 11 is a circuit diagram of a filter device according to the fourth example embodiment of the present invention.

A filter device 50 is a ladder filter. The filter device 50 includes a first signal terminal 52, a second signal terminal 53, a plurality of series arm resonators, and a plurality of parallel arm resonators. In the present example embodiment, all of the series arm resonators and all of the parallel arm resonators are acoustic wave resonators. All of the acoustic wave resonators are the acoustic wave devices according to example embodiments of the present invention. However, at least one acoustic wave resonator in the filter device 50 need only be an acoustic wave device according to an example embodiment of the present invention.

The first signal terminal 52 and the second signal terminal 53 may be configured as, for example, electrode pads, or may be configured as wirings. In the present example embodiment, the first signal terminal 52 is an antenna terminal. The antenna terminal is connected to an antenna.

Specifically, the plurality of series arm resonators of the filter device 50 are a series arm resonator S1, a series arm resonator S2, and a series arm resonator S3. Specifically, the plurality of parallel arm resonators are a parallel arm resonator P1 and a parallel arm resonator P2.

The series arm resonator S1, the series arm resonator S2, and the series arm resonator S3 are connected in series to each other between the first signal terminal 52 and the second signal terminal 53. The parallel arm resonator P1 is connected between a connection point between the series arm resonator S1 and the series arm resonator S2 and a ground potential. The parallel arm resonator P2 is connected between a connection point between the series arm resonator S2 and the series arm resonator S3 and the ground potential. The circuit configuration of the filter device 50 is not limited to the above-described configuration. In a case where the filter device 50 is the ladder filter, the filter device 50 need only include at least one series arm resonator and at least one parallel arm resonator.

Alternatively, the filter device 50 may include, for example, a longitudinally coupled resonator-type acoustic wave filter. In this case, the filter device 50 may include, for example, a series arm resonator or a parallel arm resonator connected to the longitudinally coupled resonator-type acoustic wave filter. The series arm resonator or the parallel arm resonator need only be an acoustic wave device according to an example embodiment of the present invention.

A resonant frequency of the series arm resonator constituting a pass band of the filter device 50 is located in a pass band of the filter device 50. Therefore, the influence of the unnecessary wave generated in the vicinity of the resonant frequency in the series arm resonator on the electrical characteristics in the pass band in the filter device 50 is particularly large. A resonant frequency of the parallel arm resonator constituting a pass band of the filter device 50 is located in the vicinity of the pass band of the filter device 50. Therefore, the influence of the unnecessary wave generated in the vicinity of the resonant frequency in the parallel arm resonator on the electrical characteristics in the pass band in the filter device 50 is also large.

In the present example embodiment, each parallel arm resonator and each series arm resonator include an acoustic wave device according to an example embodiment of the present invention. Therefore, it is possible to reduce or prevent the unnecessary wave in the vicinity of the resonant frequency in each parallel arm resonator and each series arm resonator. As a result, it is possible to reduce or prevent the influence of the unnecessary wave on the electrical characteristics in the pass band of the filter device 50. Therefore, it is possible to reduce or prevent the deterioration in the filter characteristics of the filter device 50.

It is preferable that an acoustic wave device according to an example embodiment of the present invention is used as the series arm resonator in the ladder filter. As described above, the influence of the unnecessary wave generated in the vicinity of the resonant frequency in the series arm resonator on the electrical characteristics in the pass band in the filter device 50 as the ladder filter is particularly large. Therefore, with the above-described configuration, it is possible to effectively reduce or prevent the deterioration in the filter characteristics of the filter device 50.

Hereinafter, the details of the thickness shear mode will be described. It should be noted that the "electrode" in the IDT electrode described later corresponds to an electrode finger according to an example embodiment of the present invention. The support in the following example corresponds to a support substrate according to an example embodiment of the present invention.

Figure 12A:
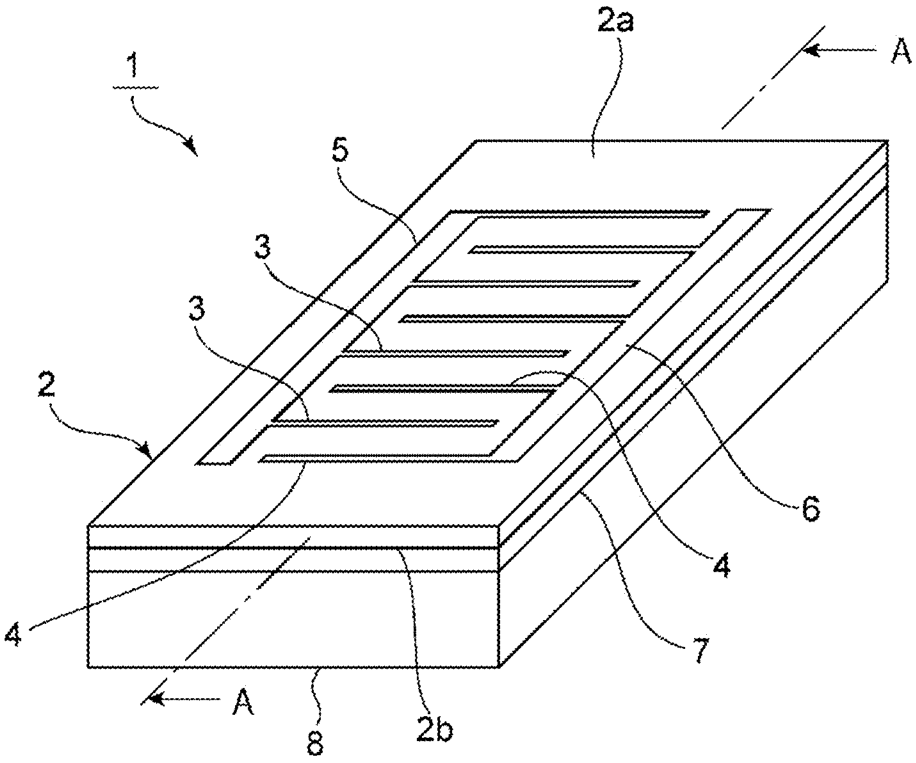
FIG. 12A is a schematic perspective view showing an appearance of an acoustic wave device using a bulk wave in a thickness shear mode.
Figure 12B:
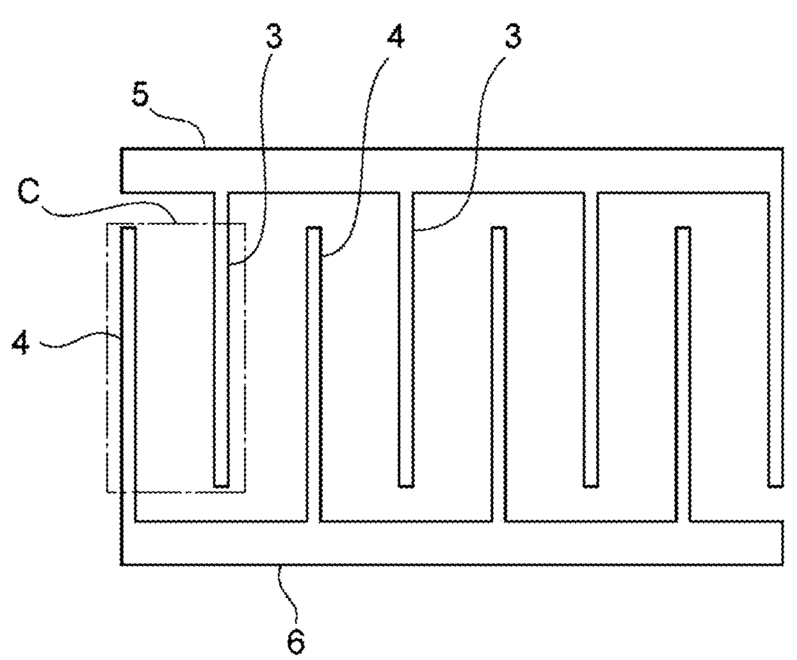
FIG. 12B is a plan view showing an electrode structure on a piezoelectric layer.
Figure 13:
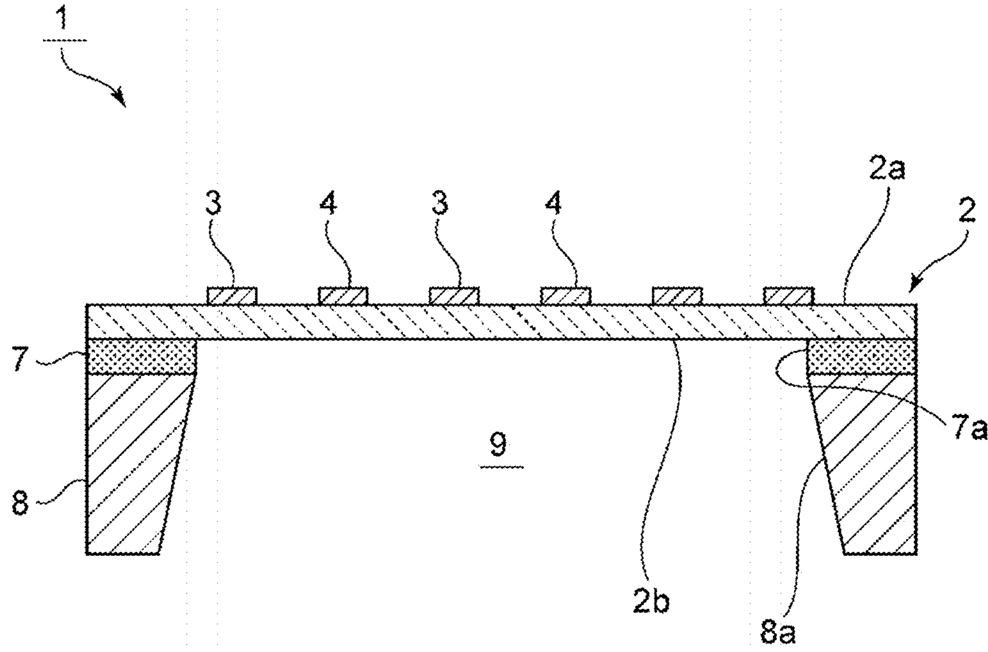
FIG. 13 is a cross-sectional view of a portion taken along line A-A in FIG. 12A.

FIG. 12A is a schematic perspective view showing an appearance of the acoustic wave device using the bulk wave in the thickness shear mode, and FIG. 12B is a plan view showing the electrode structure on the piezoelectric layer, and FIG. 13 is a cross-sectional view of a portion taken along line A-A in of FIG. 12A.

An acoustic wave device 1 includes a piezoelectric layer 2 formed of $LiNbO_3$. The piezoelectric layer 2 may include $LiTaO_3$. A cut-angle of $LiNbO_3$ or $LiTaO_3$ is a Z cut, but may be a rotation Y cut or an X cut. The thickness of the piezoelectric layer 2 is not particularly limited, but is preferably about 40 nm or more and about 1000 nm or less, and more preferably about 50 nm or more and about 1000 nm or less in order to effectively excite the thickness shear mode, for example. The piezoelectric layer 2 has first and second main surfaces 2*a* and 2*b* facing each other. Electrodes 3 and 4 are provided on the first main surface 2*a*. Here, the electrode 3 is an example of a "first electrode" and the electrode 4 is an example of a "second electrode". In FIGS. 12A and 12B, the plurality of electrodes 3 are a plurality of first electrode fingers connected to a first busbar 5. The plurality of electrodes 4 are a plurality of second electrode fingers connected to a second busbar 6. The plurality of electrodes 3 and the plurality of electrodes 4 are interdigitated with each other. Each of the electrodes 3 and 4 has a rectangle shape and a length direction. The electrode 3 and the electrode 4 adjacent thereto face each other in a direction perpendicular or substantially perpendicular the length direction. Both the length direction of the electrodes 3 and 4 and the direction perpendicular or 3 and 4 are directions crossing a thickness direction of the piezoelectric layer 2. Therefore, it can be said that the electrode 3 and the electrode 4 adjacent thereto face each other in the direction crossing the thickness direction of the piezoelectric layer 2. In addition, the length direction of the electrodes 3 and 4 may be changed to the direction perpendicular or substantially perpendicular the length direction of the electrodes 3 and 4 shown in FIGS. 12A and 12B. That is, in FIGS. 12A and 12B, the electrodes 3 and 4 may extend in the direction in which the first busbar 5 and the second busbar 6 extend. In this case, the first busbar 5 and the second busbar 6 extend in the direction in which the electrodes 3 and 4 extend in FIGS. 12A and 12B. A plurality of pairs of structures in which the electrode 3 connected to one potential and the electrode 4 connected to the other potential are adjacent to each other are provided in a direction perpendicular or substantially perpendicular the length direction of the electrodes 3 and 4. Here, a case where the electrodes 3 and 4 are adjacent to each other does not mean a case where the electrodes 3 and 4 are disposed to be in direct contact with each other, but mean a case where the electrodes 3 and 4 are disposed with a gap therebetween. In a case where the electrodes 3 and 4 are adjacent to each other, the electrodes connected to a hot electrode or a ground electrode, including the other electrodes 3 and 4, are not disposed between the electrodes 3 and 4. The number of pairs does not have to be integer pairs, but may be 1.5 pairs, 2.5 pairs, or the like. The center-to-center distance, that is, the pitch between the electrodes 3 and 4 is preferably in a range of about 1 μm or more and about 10 μm or less, for example. The widths of the electrodes 3 and 4, that is, the dimensions of the electrodes 3 and 4 in the facing direction are preferably in a range of about 50 nm or more and about 1000 nm or less, and more preferably in a range of about 150 nm or more and about 1000 nm or less, for example. It should be noted that the center-to-center distance between the electrodes 3 and 4 is a distance connecting the center of the dimension (width dimension) of the electrode 3 in the direction perpendicular or substantially perpendicular the length direction of the electrode 3 and the center of the dimension (width dimension) of the electrode 4 in the direction perpendicular or substantially perpendicular the length direction of the electrode 4.

In the acoustic wave device 1, since the Z-cut piezoelectric layer is used, the direction perpendicular or substantially perpendicular the length direction of the electrodes 3 and 4 is a direction perpendicular or substantially perpendicular a polarization direction of the piezoelectric layer 2. This shall not be applied to case where a piezoelectric material with a different cut-angle is used as the piezoelectric layer 2. Here, "orthogonal" is not limited to being strictly orthogonal, but may be substantially orthogonal (angle between the direction perpendicular or substantially perpendicular the length direction of the electrodes 3 and 4 and the polarization direction is, for example, in a range of about 90°+) 10°.

A support 8 is laminated on the second main surface 2*b* side of the piezoelectric layer 2 with an insulating layer 7 interposed therebetween. The insulating layer 7 and the support 8 have a frame shape and have through holes 7*a* and 8*a* as shown in FIG. 13. As a result, a cavity portion 9 is formed. The cavity portion 9 is provided not to disturb the vibration of the excitation region C of the piezoelectric layer 2. Therefore, the support 8 is laminated on the second main surface 2*b* with the insulating layer 7 interposed therebetween at a position not overlapping the portion in which at least one pair of electrodes 3 and 4 is provided. It should be noted that the insulating layer 7 does not have to be provided. Therefore, the support 8 can be directly or indirectly laminated on the second main surface 2*b* of the piezoelectric layer 2.

The insulating layer 7 includes silicon oxide. However, in addition to silicon oxide, an appropriate insulating material such as silicon oxynitride or alumina can be used. The support 8 includes Si. A plane orientation of the plane of Si on the piezoelectric layer 2 side may be (100), (110), or (111). Si that forms the support 8 is desirably high resistance having a resistivity of about 4 kΩcm or more. However, the support 8 can also be formed of an appropriate insulating material or semiconductor material.

Examples of the material of the support 8 include piezoelectric materials such as aluminum oxide, lithium tantalate, lithium niobate, and quartz crystal, various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride.

The plurality of electrodes 3 and 4 and the first and second busbars 5 and 6 are formed of appropriate metals or alloys such as Al and AlCu alloys. In the acoustic wave device 1, the electrodes 3 and 4 and the first and second busbars 5 and 6 have a structure in which an Al film is laminated on a Ti film. It should be noted that a close contact layer other than the Ti film may be used.

During driving, the AC voltage is applied between the plurality of electrodes 3 and the plurality of electrodes 4. More specifically, the AC voltage is applied between the first busbar 5 and the second busbar 6. As a result, it is possible to obtain the resonance characteristics using the bulk wave in the thickness shear mode excited in the piezoelectric layer 2. In the acoustic wave device 1, in a case where d is the thickness of the piezoelectric layer 2 and p is the center-to-center distance between any adjacent electrodes 3 and 4 among the plurality of pairs of electrodes 3 and 4, d/p is about 0.5 or less, for example. As a result, the bulk wave in the thickness shear mode is effectively excited, and good resonance characteristics can be obtained. More preferably, d/p is about 0.24 or less, for example, and in this case, better resonance characteristics can be obtained.

In the acoustic wave device 1, since the above-described configuration is provided, even in a case where the number of pairs of the electrodes 3 and 4 is reduced in order to reduce the size, the Q value is unlikely to be decreased. This is because the propagation loss is small even in a case where the number of electrode fingers in the reflectors on both sides is small. In addition, the number of electrode fingers can be reduced by using the bulk wave in the thickness shear mode. A difference between the Lamb wave used in the acoustic wave device and the bulk wave in the thickness shear mode will be described with reference to FIGS. 14A and 14B.

Figure 14A:
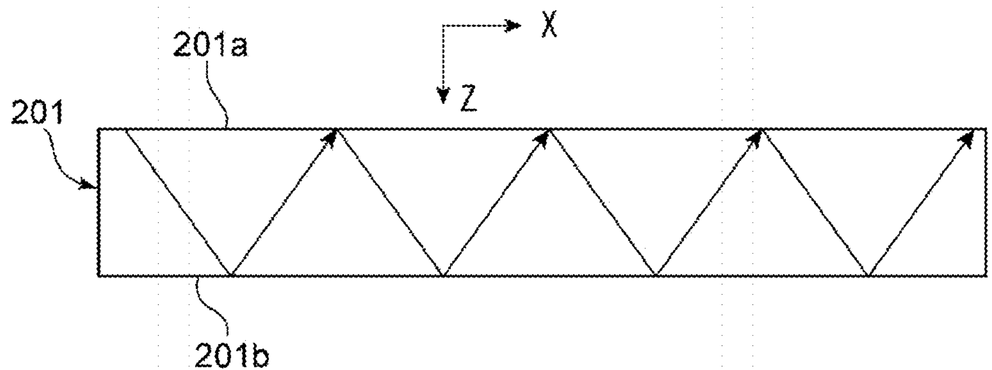
FIG. 14A is a schematic elevational cross-sectional view showing a Lamb wave that propagates through a piezoelectric film of the acoustic wave device.

FIG. 14A is a schematic elevational cross-sectional view showing the Lamb wave that propagates through the piezoelectric film of the acoustic wave device as disclosed in Japanese Unexamined Patent Application Publication No. 2012-257019. Here, the wave propagates in a piezoelectric film 201 as indicated by an arrow. Here, in the piezoelectric film 201, a first main surface 201*a* and a second main surface 201*b* face each other, and a thickness direction connecting the first main surface 201*a* and the second main surface 201*b* is a Z direction. An X direction is a direction in which the electrode fingers of the IDT electrodes are arranged. As shown in FIG. 14A, in the Lamb wave, the wave propagates in the X direction as shown in the figure. Since the wave is a plate wave, although the piezoelectric film 201 vibrates as a whole, since the wave propagates in the X direction, the reflectors are disposed on both sides to obtain the resonance characteristics. Therefore, the propagation loss of the wave occurs, and the Q value is decreased in a case where the size reduction is attempted, that is, in a case where the number of pairs of the electrode fingers is decreased.

Figure 14B:
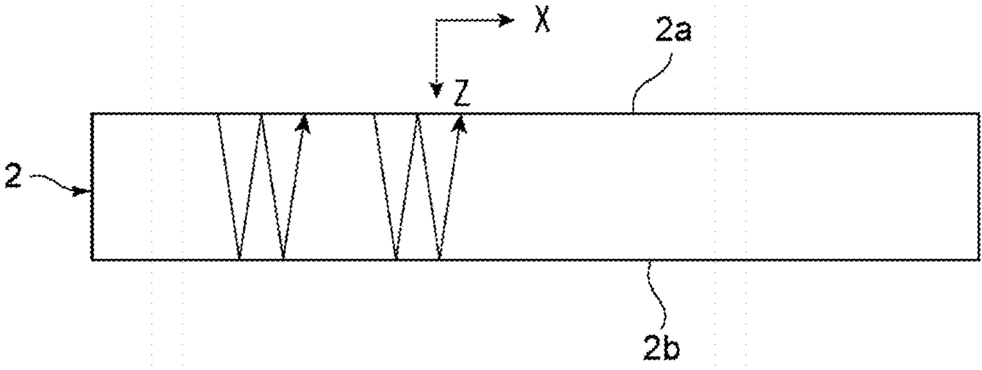
FIG. 14B is a schematic elevational cross-sectional view showing a bulk wave in a thickness shear mode that propagates through the piezoelectric film of the acoustic wave device.

On the other hand, as shown in FIG. 14B, in the acoustic wave device 1, since the vibration displacement is a thickness shear direction, the wave propagates and resonates in the direction connecting the first main surface 2*a* and the second main surface 2*b* of the piezoelectric layer 2, that is, the Z direction. That is, an X-direction component of the wave is significantly smaller than a Z-direction component. In addition, since the resonance characteristics are obtained by the propagation of the wave in the Z direction, the propagation loss is unlikely to occur even when the number of the electrode fingers of the reflector is reduced. Further, even in a case where the number of pairs of the electrode pair including the electrodes 3 and 4 is reduced when the size reduction is attempted, the Q value is unlikely to be decreased.

Figure 15:
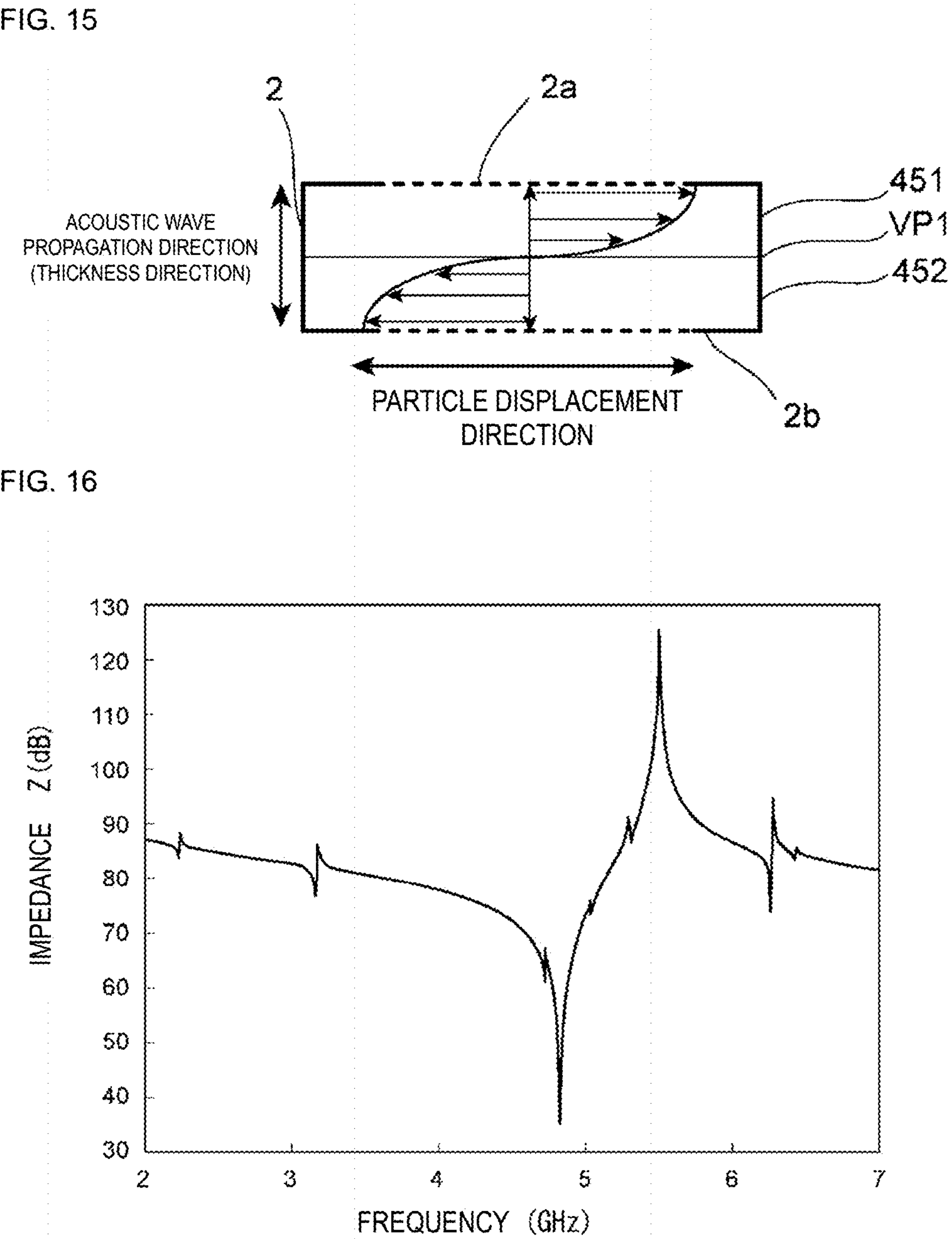
FIG. 15 is a view showing an amplitude direction of the bulk wave in the thickness shear mode.

It should be noted that amplitude directions of the bulk waves of the thickness shear mode are opposite to each other between a first region 451 included in the excitation region C of the piezoelectric layer 2 and a second region 452 included in the excitation region C, as shown in FIG. 15. FIG. 15 schematically shows the bulk waves when the voltage is applied between the electrodes 3 and 4 so that the potential of the electrode 4 is higher than the potential of the electrode 3. The first region 451 is a region of the excitation region C between a virtual plane VP1, which is perpendicular or substantially perpendicular to the thickness direction of the piezoelectric layer 2 and bisects the piezoelectric layer 2, and the first main surface 2*a*. The second region 452 is a region of the excitation region C between the virtual plane VP1 and the second main surface 2*b*.

As described above, in the acoustic wave device 1, although at least one pair of electrodes including the electrodes 3 and 4 is disposed, the waves are not propagated in the X direction, and thus the number of pairs of the electrode pair including the electrodes 3 and 4 does not have to be plural. That is, at least one pair of electrodes need only be provided.

For example, the electrode 3 is an electrode connected to a hot potential and the electrode 4 is an electrode connected to a ground potential. However, the electrode 3 may be connected to the ground potential and the electrode 4 may be connected to the hot potential. In the acoustic wave device 1, at least one pair of electrodes is the electrodes connected to the hot potential or the electrodes connected to the ground potential, as described above, and no floating electrodes are provided.

FIG. 16 is a view showing the resonance characteristics of the acoustic wave device shown in FIG. 13. It should be noted that example design parameters of the acoustic wave device 1 with the resonance characteristics are as follows.

Piezoelectric layer 2: $LiNbO_3$ with Euler angles (0°, 0°, 90°), thickness=400 nm.

When viewed in the direction perpendicular or 3 and 4, the length of the region in which the electrodes 3 and 4 overlap each other, that is, the length of the excitation region C=40 μm, the number of pairs of the electrodes including the electrodes 3 and 4=21 pairs, the distance between the center of the electrodes=3 μm, the width of the electrodes 3 and 4=500 nm, and d/p=0.133.

Insulating layer 7: silicon oxide film having a thickness of 1 μm.

Support 8: Si.

It should be noted that the length of the excitation region C is the dimension along the length direction of the electrodes 3 and 4 of the excitation region C.

In the acoustic wave device 1, an electrode-to-electrode distance of the electrode pair including the electrodes 3 and 4 is made equal or substantially equal in all of the plurality of pairs. That is, the electrodes 3 and 4 are disposed at equal or substantially equal pitches.

As is clear from FIG. 16, good resonance characteristics with the fractional bandwidth of about 12.5%, for example, are obtained regardless of the presence of the reflector.

In a case where the thickness of the piezoelectric layer 2 is d and the center-to-center distance of the electrodes 3 and 4 is p, in the acoustic wave device 1, as described above, d/p is about 0.5 or less, more preferably about 0.24 or less, for example. The description thereof will be made with reference to FIG. 17.

Figure 17:
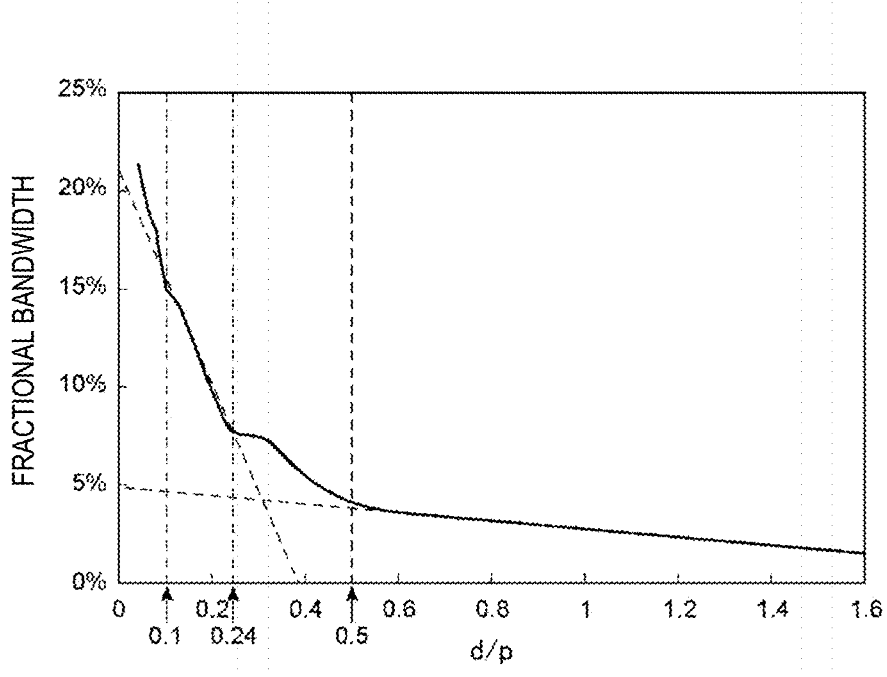
FIG. 17 is a view showing a relationship between d/p and a fractional bandwidth as a resonator in a case where a center-to-center distance of electrodes adjacent to each other is p and a thickness of a piezoelectric layer is d.

A plurality of acoustic wave devices are obtained by changing d/p in the same manner as the acoustic wave device that obtains the resonance characteristics shown in FIG. 16. FIG. 17 is a view showing a relationship between d/p and the fractional bandwidth as the resonator of the acoustic wave device.

As is clear from FIG. 17, when d/p>about 0.5, the fractional bandwidth is less than about 5% even in a case where d/p is adjusted, for example. On the other hand, in a case where d/p>about 0.5, when d/p is changed within this range, the fractional bandwidth of about 5% or more can be obtained, for example, and the resonator having a high coupling coefficient can be formed. In addition, in a case where d/p is about 0.24 or less, the fractional bandwidth can be increased to about 7% or more, for example. In addition, by adjusting d/p within this range, a resonator with a wider fractional bandwidth can be obtained, and a resonator with a higher coupling coefficient can be realized. Therefore, it can be seen that, by adjusting d/p to about 0.5 or less, for example it is possible to configure a resonator having a high coupling coefficient using the bulk wave in the thickness shear mode.

Figure 18:
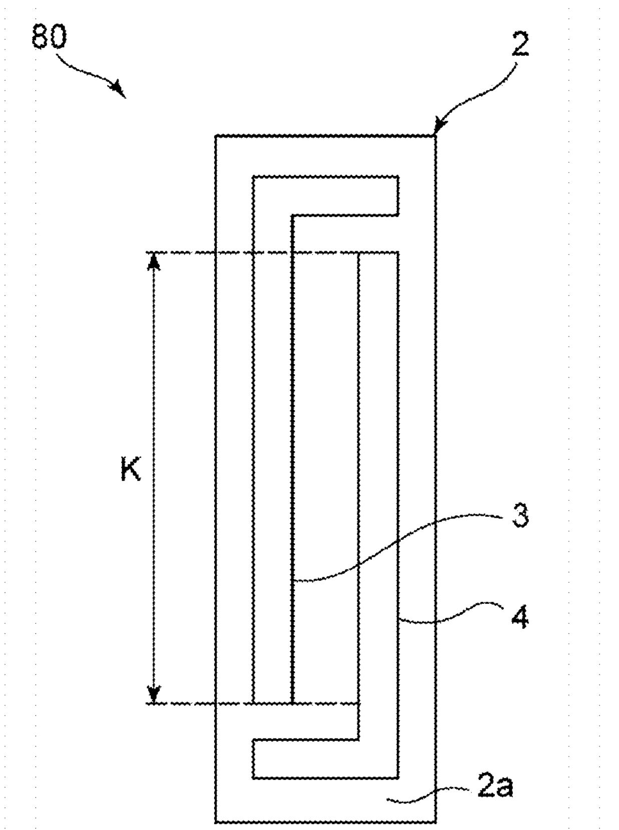
FIG. 18 is a plan view of the acoustic wave device using the bulk wave in the thickness shear mode.

FIG. 18 is a plan view of the acoustic wave device using the bulk wave in the thickness shear mode. In an acoustic wave device 80, the one pair of electrodes including the electrode 3 and electrode 4 is provided on the first main surface 2*a* of the piezoelectric layer 2. It should be noted that K in FIG. 18 is a cross width. As described above, in the acoustic wave device according to the present invention, the number of pairs of the electrodes may be one pair. Even in this case, when d/p is about 0.5 or less, for example, it is possible to effectively excite the bulk wave in the thickness shear mode.

Figure 19:
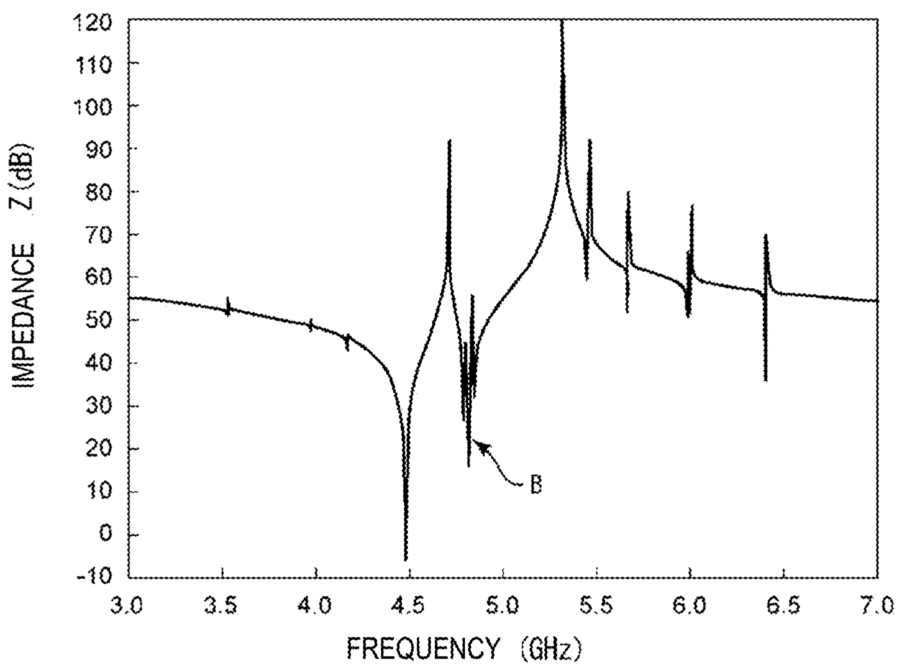
FIG. 19 is a view showing resonance characteristics of an acoustic wave device of a reference example in which spurious appears.

In the acoustic wave device 1, preferably, it is desirable that the metallization ratio MR of any adjacent electrodes 3 and 4 among the plurality of electrodes 3 and 4 to the excitation region C, which is the region in which the adjacent electrodes 3 and 4 overlap each other when viewed in the facing direction, satisfies MR≤about 1.75 (d/p)+0.075, for example. In this case, the spurious can be effectively reduced. The description thereof will be made with reference to FIGS. 19 and 20. FIG. 19 is a reference view showing an example of the resonance characteristics of the acoustic wave device 1. The spurious indicated by an arrow B appears between the resonant frequency and the anti-resonant frequency. It should be noted that d/p=0.08 and the Euler angles of $LiNbO_3$ are (0°, 0°, 90°). Also, the metallization ratio MR is about 0.35, for example.

The metallization ratio MR will be described with reference to FIG. 12B. In the electrode structure of FIG. 12B, it is assumed that, when focusing on the one pair of electrodes 3 and 4, only the one pair of electrodes 3 and 4 is provided. In this case, a portion surrounded by a one-dot chain line is the excitation region C. The excitation region C is a region of the electrode 3 that overlaps the electrode 4 when the electrode 3 and the electrode 4 are viewed in the direction perpendicular or 3 and 4, that is, in the facing direction, a region of the electrode 4 that overlaps the electrode 3, and a region in which the electrode 3 and the electrode 4 overlap each other in the region between the electrode 3 and the electrode 4. An area of the electrodes 3 and 4 in the excitation region C with respect to an area of this excitation region C is the metallization ratio MR. That is, the metallization ratio MR is a ratio of an area of the metallization portion to the area of the excitation region C.

It should be noted that, in a case where the plurality of pairs of electrodes are provided, a ratio of the metallization portion included in the entire excitation region to a total area of the excitation region need only be MR.

Figure 20:
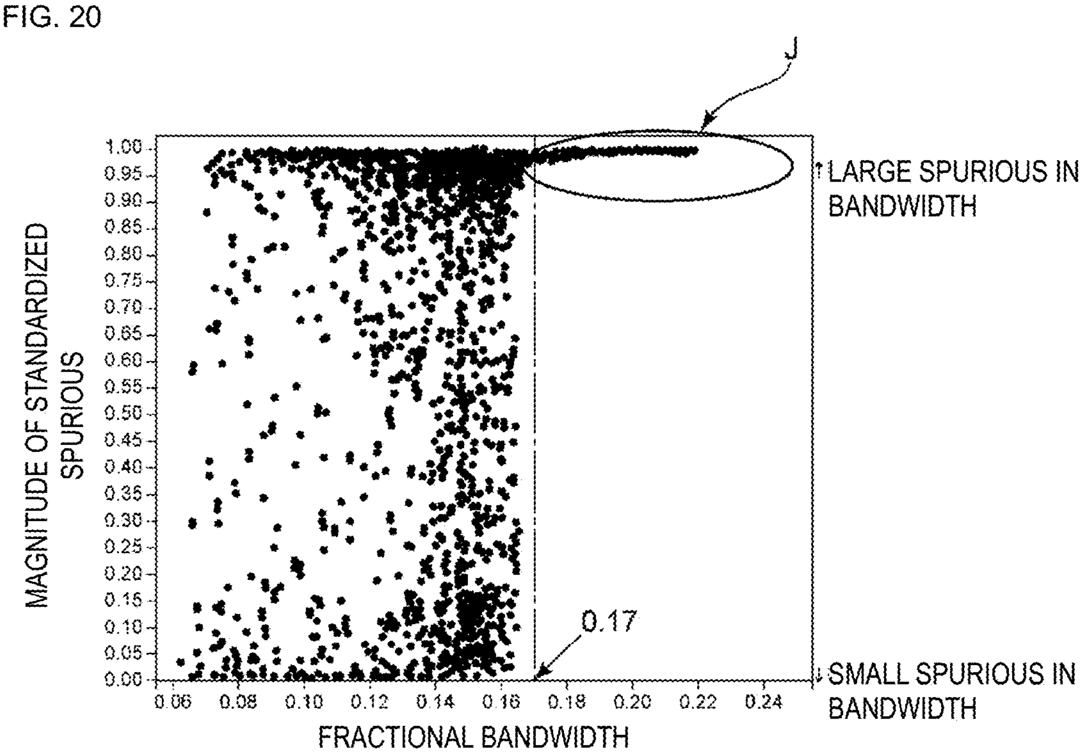
FIG. 20 is a view showing a relationship between a fractional bandwidth and a phase rotation amount of an impedance of the spurious standardized at 180 degrees as a magnitude of the spurious.

FIG. 20 is a view showing a relationship between a fractional bandwidth and a phase rotation amount of an impedance of the spurious standardized at 180 degrees as a magnitude of the spurious in a case where a large number of acoustic wave resonators are configured according to an example embodiment of the acoustic wave device 1. It should be noted that the fractional bandwidth is adjusted by changing the film thickness of the piezoelectric layer and the dimensions of the electrodes. Moreover, FIG. 20 shows the results in a case where the piezoelectric layer formed of the Z-cut $LiNbO_3$ is used, but the same tendency is obtained in a case where piezoelectric layers with other cut-angles are used.

In a region surrounded by an ellipse J in FIG. 20, the spurious is as large as about 1.0, for example. As is clear from FIG. 20, in a case where the fractional bandwidth exceeds about 0.17, that is, exceeds about 17%, for example, a large spurious with a spurious level of 1 or more appears in a pass band even when the parameters constituting the fractional bandwidth are changed. That is, as in the resonance characteristics shown in FIG. 19, a large spurious indicated by an arrow B appears within the band. Therefore, the fractional bandwidth is preferably about 17% or less, for example. In this case, by adjusting the film thickness of the piezoelectric layer 2 and the dimensions of the electrodes 3 and 4, the spurious can be reduced.

Figure 21:
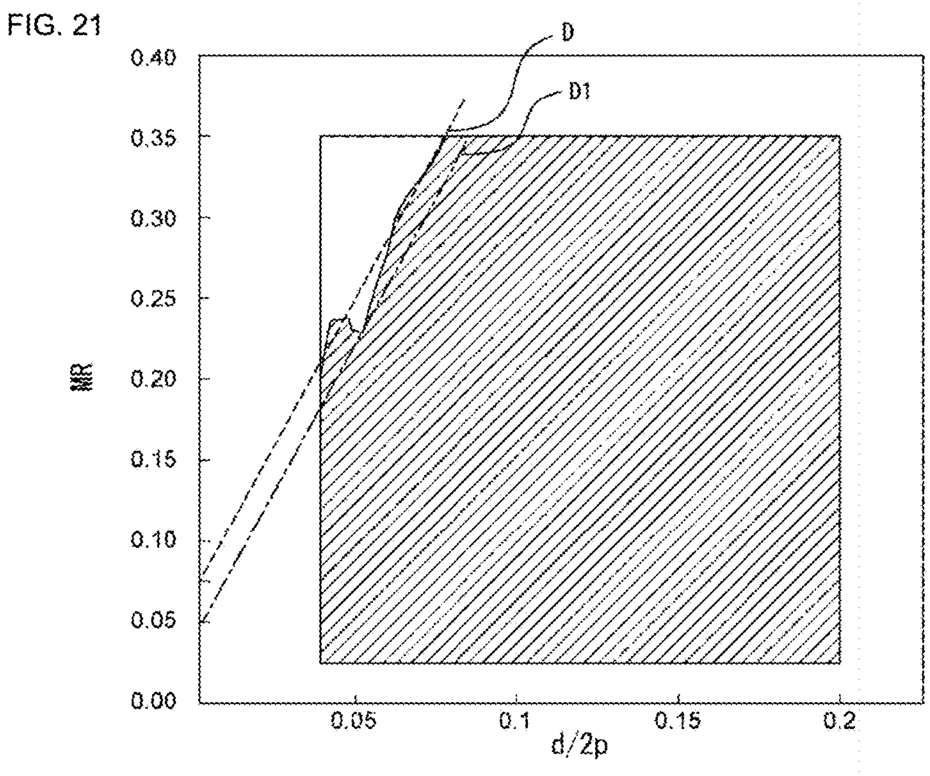
FIG. 21 is a view showing a relationship between d/2p and a metallization ratio MR.

FIG. 21 is a view showing a relationship between d/2p, the metallization ratio MR, and the fractional bandwidth. In the acoustic wave device described above, various acoustic wave devices having different d/2p and MR are configured, and the fractional bandwidth is measured. A hatched portion on a right side of a broken line D in FIG. 21 is a region in which the fractional bandwidth is about 17% or less, for example. A boundary between the hatched region and a non-hatched region is expressed by MR=about 3.5 (d/2p)+0.075, for example. That is, MR=1.75 (d/p)+0.075, for example. Therefore, preferably, MR≤about 1.75 (d/p)+0.075, for example. In this case, it is easy to set the fractional bandwidth to about 17% or less, for example. More preferably, it is a region on a right side of MR=about 3.5 (d/2p)+0.05 indicated by a one-dot chain line D1 in FIG. 21, for example. That is, in a case where MR≤about 1.75 (d/p)+0.05, the fractional bandwidth can be reliably set to about 17% or less, for example.

Figure 22:
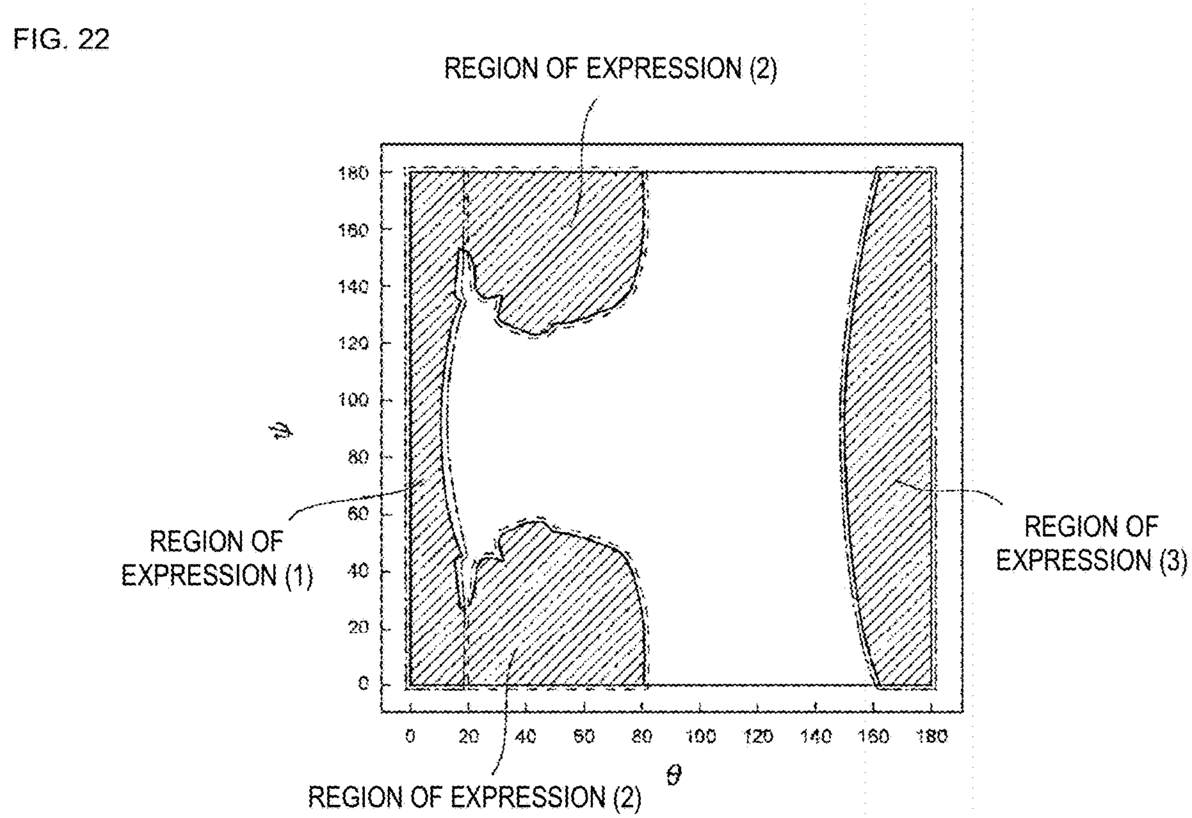
FIG. 22 is a view showing a map of the fractional bandwidth with respect to Euler angles (0°, θ, ψ) of $LiNbO_3$ in a case where d/p is infinitely close to 0.

FIG. 22 is a view showing a map of the fractional bandwidth with respect to Euler angles (0°, θ, ψ) of $LiNbO_3$ in a case where d/p is infinitely close to 0. A hatched portion in FIG. 22 is a region in which the fractional bandwidth of at least about 5% or more is obtained, and in a case where a range of the region is approximated, the range is a range represented by Expressions (1), (2), and (3).

$$(0° \pm 10°, 0° \text{ to } 20°, \text{any } \psi) \quad \text{Expression (1)}$$

$$(0° \pm 10°, 20° \text{ to } 80°, 0° \text{ to } 60°(1-(\theta-50)^2/900)^{1/2}) \text{ or } (0° \pm 10°, 20° \text{ to } 80°, [180° - 60°(1-(\theta-50)^2/900)^{1/2}] \text{ to } 180°) \quad \text{Expression (2)}$$

$$(0° \pm 10°, [180° - 30°(1-(\psi-90)^2/8100)^{1/2}] \text{ to } 180°, \text{any } \psi) \quad \text{Expression (3)}$$

Therefore, in a case of the Euler angle range of Expression (1), Expression (2), or Expression (3), the fractional bandwidth can be sufficiently widened, which is preferable. The same applies to a case where the piezoelectric layer 2 is the lithium tantalate layer.

Figure 23:
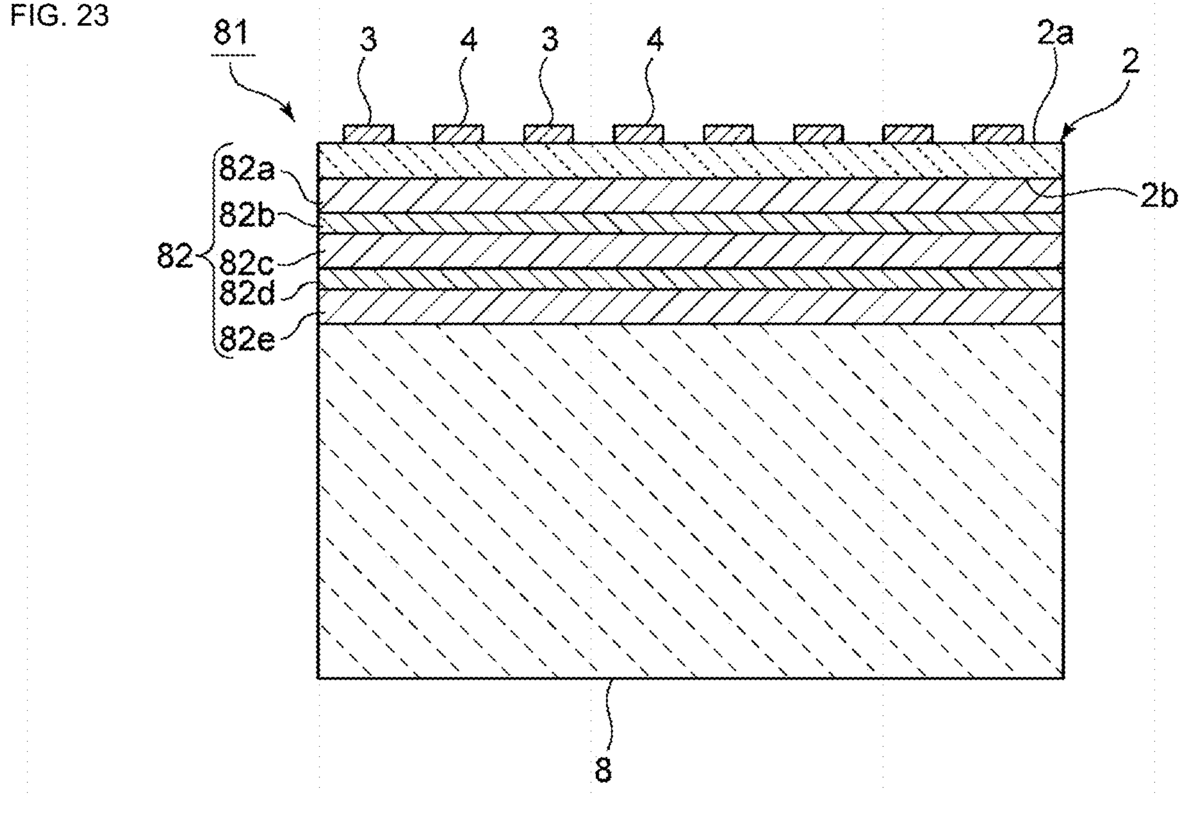
FIG. 23 is an elevational cross-sectional view of the acoustic wave device having an acoustic multilayer film.

FIG. 23 is an elevational cross-sectional view of the acoustic wave device having the acoustic multilayer film.

In an acoustic wave device 81, an acoustic multilayer film 82 is laminated on the second main surface 2*b* of the piezoelectric layer 2. The acoustic multilayer film 82 has a laminated structure of low acoustic impedance layers 82*a*, 82*c*, and 82*e* having a relatively low acoustic impedance and high acoustic impedance layers 82*b* and 82*d* having a relatively high acoustic impedance. In a case where the acoustic multilayer film 82 is used, the bulk wave in the thickness shear mode can be confined in the piezoelectric layer 2 without using the cavity portion 9 of the acoustic wave device 1. Also in the acoustic wave device 81, the resonance characteristics based on the bulk wave in the thickness shear mode can be obtained by adjusting d/p to about 0.5 or less, for example. It should be noted that, in the acoustic multilayer film 82, the number of laminated layers of the low acoustic impedance layers 82*a*, 82*c*, and 82*e* and the high acoustic impedance layers 82*b* and 82*d* is not particularly limited. At least one layer of the high acoustic impedance layers 82*b* and 82*d* need only be disposed on a side farther from the piezoelectric layer 2 than the low acoustic impedance layers 82*a*, 82*c*, and 82*e*.

The low acoustic impedance layers 82*a*, 82*c*, and 82*e* and the high acoustic impedance layers 82*b* and 82*d* can be formed of an appropriate material as long as the above-described relationship of the acoustic impedance is satisfied. Examples of the materials of the low acoustic impedance layers 82*a*, 82*c*, and 82*e* include silicon oxide and silicon oxynitride. In addition, examples of the materials of the high acoustic impedance layers 82*b* and 82*d* include alumina, silicon nitride, and metal.

In the acoustic wave devices according to the first to third example embodiments, for example, the acoustic multilayer film 82 shown in FIG. 23 may be provided as the acoustic reflection film between the support and the piezoelectric layer. Specifically, the support and the piezoelectric layer may be disposed such that at least a portion of the support and at least a portion of the piezoelectric layer face each other with the acoustic multilayer film 82 interposed therebetween. In this case, in the acoustic multilayer film 82, the low acoustic impedance layer and the high acoustic impedance layer need only be alternately laminated. The acoustic multilayer film 82 may be the acoustic reflection portion in the acoustic wave device.

In the acoustic wave devices according to the first to third example embodiments that use the bulk wave in the thickness shear mode, as described above, d/p is preferably about 0.5 or less, and more preferably about 0.24 or less, for example. As a result, better resonance characteristics can be obtained. Further, in the excitation regions in the acoustic wave devices according to the first to third example embodiments that use the bulk wave in the thickness shear mode, as described above, preferably, MR≤about 1.75 (d/p)+0.075 is satisfied, for example. In this case, it is possible to more reliably reduce or prevent the spurious.

The functional electrodes in the acoustic wave devices according to the first to third example embodiments that use the bulk wave in the thickness shear mode may be the functional electrodes having the one pair of electrodes shown in FIG. 18.

It is preferable that the piezoelectric layers in the acoustic wave devices according to the first to third example embodiments that use the bulk wave in the thickness shear mode are the lithium niobate layer or the lithium tantalate layer. In addition, it is preferable that the Euler angles (φ, θ, ψ) of lithium niobate or lithium tantalate included in the piezoelectric layer are in the range of Expression (1), Expression (2), or Expression (3). In this case, the fractional bandwidth can be sufficiently widened.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric substrate including a support that includes a support substrate, and a piezoelectric layer that is provided on the support and includes lithium tantalate or lithium niobate;

a functional electrode provided on the piezoelectric layer and including at least one pair of electrode fingers; and a dielectric film provided on the piezoelectric layer to cover the at least one pair of electrode fingers; wherein an acoustic reflection portion is provided at a position overlapping at least a portion of the functional electrode in plan view;

in a case where a thickness of the piezoelectric layer is d and a center-to-center distance between the at least one pair of electrode fingers adjacent to each other is p, d/p is about 0.5 or less;

each of the at least one pair of electrode fingers includes a first surface and a second surface that face each other in a thickness direction, and a side surface that is connected to the first surface and the second surface, the first surface being located on a piezoelectric layer side;

the side surface of each of the at least one pair of electrode fingers includes a first side surface portion and a second side surface portion that face each other in a direction perpendicular or substantially perpendicular a direction in which each of the at least one pair of electrode fingers extends;

the dielectric film includes a first side surface cover portion that covers the first side surface portion of each of the at least one pair electrode fingers, and a second side surface cover portion that covers the second side surface portion of each of the at least one pair of electrode fingers, the first side surface cover portion including a first outer surface, the second side surface cover portion including a second outer surface; and in a case where an angle of a corner defined by the first surface and the first side surface portion of each of the at least one pair of electrode fingers is θ1, an angle of a corner defined by the first surface and the second side surface portion is θ2, an angle of a corner defined by a first virtual plane extending parallel or substantially parallel to the first surface from an edge portion of the first outer surface of the dielectric film on the piezoelectric layer side toward a second side surface cover portion side, and the first outer surface is θ3, and an angle of a corner defined by a second virtual plane extending parallel or substantially parallel to the first surface from an edge portion of the second outer surface on the piezoelectric layer side toward a first side surface cover portion side, and the second outer surface is θ4, at least one of θ1≠θ3 or θ2≠θ4 is satisfied.

2. The acoustic wave device according to claim 1, wherein both θ1<θ3 and θ2<θ4 are satisfied.

3. The acoustic wave device according to claim 1, wherein θ1<θ3 is satisfied, and θ2≠θ4 is not satisfied.

4. The acoustic wave device according to claim 1, wherein, in a case where a direction, which is perpendicular or substantially perpendicular to the direction in which each of the at least one pair of electrode fingers extends and is parallel or substantially parallel to the first surface of each of the at least one pair of electrode fingers, is a thickness direction of the first side surface cover portion and the second side surface cover portion of the dielectric film, thicknesses of the first side surface cover portion and the second side surface cover portion at the same position in a direction in which the first surface and the second surface of each of the at least one pair of electrode fingers face each other are different from each other.

5. The acoustic wave device according to claim 1, wherein the functional electrode is an interdigital transducer electrode including a plurality of pairs of the at least one pair of electrode fingers.

6. The acoustic wave device according to claim 1, wherein d/p is about 0.24 or less.

7. The acoustic wave device according to claim 1, wherein a region, which is a region in which the at least one pair of electrode fingers are adjacent to each other when seen from a direction in which the adjacent electrode fingers face each other and is a region between centers of the adjacent electrode fingers, is an excitation region, and in a case where a metallization ratio of the at least one pair of electrode fingers to the excitation region is MR, MR≤about 1.75 (d/p)+0.075 is satisfied.

8. The acoustic wave device according to claim 1, wherein Euler angles (ϕ, θ, ψ) of the lithium niobate or the lithium tantalate included in the piezoelectric layer are in a range of Expression (1), Expression (2), or Expression (3):

$$(0° \pm 10°, 0° \text{ to } 20°, \text{any } \psi); \quad \text{Expression (1)}$$

$$\left(0° \pm 10°, 20° \text{ to } 80°, 0° \text{ to } 60°\left(1-(\theta-50)^2/900\right)^{1/2}\right) \text{ or } \left(0° \pm 10°, 20° \text{ to } 80°, \left[180° - 60°\left(1-(\theta-50)^2/900\right)^{1/2}\right] \text{ to } 180°\right); \text{ or} \quad \text{Expression (2)}$$

$$\left(0° \pm 10°, \left[180° - 30°\left(1-(\psi-90)^2/8100\right)^{1/2}\right] \text{ to } 180°, \text{any } \psi\right). \quad \text{Expression (3)}$$

9. The acoustic wave device according to claim 1, wherein the acoustic reflection portion includes a cavity portion, and the support and the piezoelectric layer are positioned such that a portion of the support and a portion of the piezoelectric layer face each other with the cavity portion interposed between the support and the piezoelectric layer.

10. The acoustic wave device according to claim 1, wherein the acoustic wave device is a series arm resonator of a ladder filter.

11. The acoustic wave device according to claim 1, wherein the support further includes an insulating layer on the support substrate.

12. The acoustic wave device according to claim 11, wherein the insulating layer includes a recess covered by the piezoelectric layer to define a cavity portion.

13. The acoustic wave device according to claim 11, wherein the support substrate includes a recess covered by the insulating layer.

14. The acoustic wave device according to claim 1, wherein the piezoelectric layer includes a recess to define a cavity portion.

15. The acoustic wave device according to claim 1, wherein the acoustic reflection portion includes a cavity portion defined by a through hole in the support.

16. A filter device comprising the acoustic wave device according to claim 1.

17. A filter device comprising a plurality of series arm resonators and a plurality of parallel arm resonators, wherein all of the plurality of series arm resonators and all of the plurality of parallel arm resonators are acoustic wave resonators each defined by the acoustic wave device according to claim 1.

18. The filter device according to claim 17, wherein the filter device is a ladder filter.

19. A filter device comprising a plurality of series arm resonators and a plurality of parallel arm resonators, wherein at least one of the plurality of series arm resonators or at least one of the plurality of parallel arm resonators is an acoustic wave resonator defined by the acoustic wave device according to claim 1.

20. The filter device according to claim 19, wherein the filter device is a ladder filter.

* * * * *